United States Patent
Sato et al.

(10) Patent No.: US 11,121,310 B2
(45) Date of Patent: Sep. 14, 2021

(54) SPIN ELECTRONICS ELEMENT AND METHOD OF MANUFACTURING THEREOF

(71) Applicant: TOHOKU UNIVERSITY, Sendai (JP)

(72) Inventors: Soshi Sato, Sendai (JP); Masaaki Niwa, Sendai (JP); Hiroaki Honjo, Sendai (JP); Shoji Ikeda, Sendai (JP); Hideo Ohno, Sendai (JP); Tetsuo Endo, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 0 days.

(21) Appl. No.: 16/513,173

(22) Filed: Jul. 16, 2019

(65) Prior Publication Data

US 2019/0363245 A1   Nov. 28, 2019

Related U.S. Application Data

(62) Division of application No. 15/064,586, filed on Mar. 8, 2016, now Pat. No. 10,396,274.

(51) Int. Cl.
*H01L 43/08* (2006.01)
*H01L 43/12* (2006.01)
*G11C 11/16* (2006.01)
*H01L 21/66* (2006.01)

(52) U.S. Cl.
CPC ............ *H01L 43/08* (2013.01); *G11C 11/161* (2013.01); *H01L 22/20* (2013.01); *H01L 43/12* (2013.01)

(58) Field of Classification Search
CPC .... H01F 10/325; H01F 10/329; G11C 11/161
See application file for complete search history.

(56) References Cited

U.S. PATENT DOCUMENTS

| | | | |
|---|---|---|---|
| 2008/0164548 A1* | 7/2008 | Ranjan | G11C 11/1675 257/421 |
| 2013/0029431 A1 | 1/2013 | Takahashi et al. | |
| 2014/0009994 A1* | 1/2014 | Parkin | H01F 10/3218 365/80 |
| 2016/0155931 A1* | 6/2016 | Lee | H01L 43/08 257/421 |

OTHER PUBLICATIONS

Chikako Yoshida et al., "A study of dielectric breakdown mechanism in CoFeB/MgO/CoFeB magnetic tunnel junction", 2009 IEEE International Reliability Physics Symposium, Apr. 26-30, 2009, pp. 139-142.

(Continued)

*Primary Examiner* — Raj R Gupta
(74) *Attorney, Agent, or Firm* — Rabin & Berdo, P.C.

(57) ABSTRACT

A structure used in the formation of a spintronics element, the spintronics element to include a plurality of laminated layers, includes a substrate, a plurality of laminated layers formed on the substrate, an uppermost layer of the plurality of laminated layers being a non-magnetic layer containing oxygen, and a protection layer directly formed on the uppermost layer, the protection layer preventing alteration of characteristics of the uppermost layer while exposed in an atmosphere including $H_2O$, a partial pressure of $H_2O$ in the atmosphere being equal to or larger than $10^{-4}$ Pa, no other layer being directly formed on the protection layer.

16 Claims, 27 Drawing Sheets

(56) References Cited

OTHER PUBLICATIONS

Esther Carrasco et al., "Thickness-Dependent Hydroxylation of MgO(001) Thin Films", J. Phys. Chem. C, vol. 114, No. 42, Oct. 1, 2010, pp. 18207-18214.

H. Numata et al., "Scalable Cell Technology Utilizing Domain Wall Motion for High-speed MRAM", 2007 Symposium on VLSI Technology Digest of Technical Papers, Jun. 12-14, 2007, pp. 232-233.

Hironobu Tanigawa et al., "Current-Driven Domain Wall Motion in CoCrPt Wires with Perpendicular Magnetic Anisotropy", Applied Physics Express, vol. 1, No. 1, Jan. 11, 2008.

Khalid Mehmood Bhutta, "Spin Dependent Transport in Continuous and Discontinuous CoFeB/MgO Heterostructures", PhD Thesis in Physics, Fakultat far Physik, Universitat Bielefeld, Sep. 24, 2009.

Physical Electronics, "Handbook of X-ray Photoelectron Spectroscopy", pp. 40-41.

S. Fukami et al., "Current-induced domain wall motion in perpendicularly magnetized CoFeB nanowire", Applied Physics Letters, 98, 082504, Feb. 24, 2011, pp. 082504-1-082504-3.

S. Ikeda et al., "A perpendicular-anisotropy CoFeB-MgO magnetic tunnel junction", Nature Materials, vol. 9, Sep. 2010, pp. 721-724.

Shunsuke Fukami et al., "Domain Wall Motion Device for Nonvolatile Memory and Logic—Size Dependence of Device Properties", IEEE Transactions on Magnetics, vol. 50, No. 11, Nov. 2014, pp. 1-6.

Soo Young Jang et al., "Magnetic dead layer in amorphous CoFeB layers with various top and bottom structures", Journal of Applied Physics 107, 09C707, May 3, 2010.

Tetsuo Endoh et al., "Restructuring of Memory Hierarchy in Computing System with Spintronics-Based Technologies", 2012 Symposium on VLSI Technology Digest of Technical Papers, Jun. 12-14, 2012, pp. 89-90.

Y. Yanagisawa et al., "Interaction of $CO_2$ with Magnesium Oxide Surfaces: A TPD, FTIR, and Cluster-Model Calculation Study", J. Phys. Chem. vol. 99, No. 11, Feb. 15, 1995, pp. 3704-3710.

\* cited by examiner

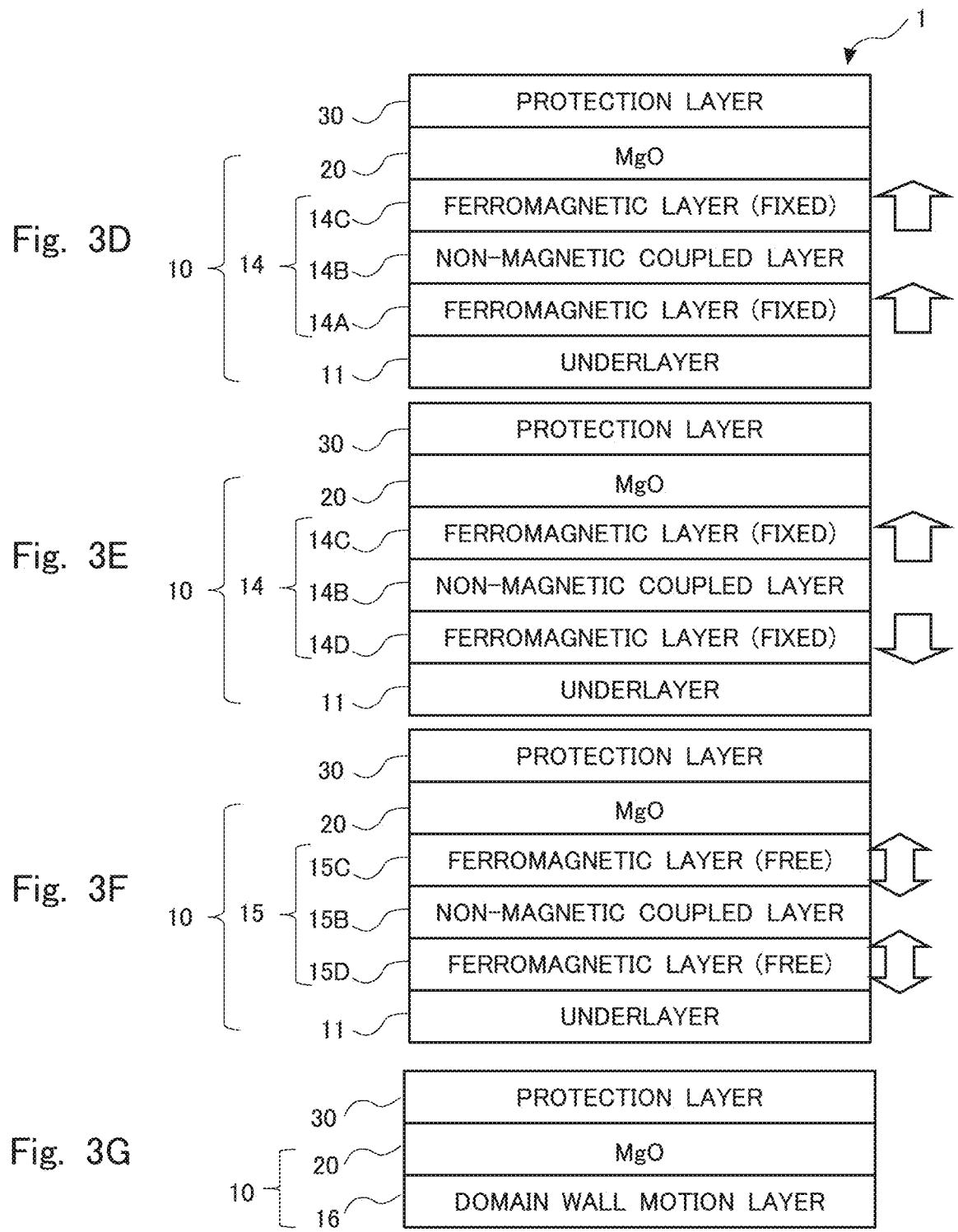

$t_{MgO}$ = 0.4, 0.8, 1.2, 3.0 nm $t_{CoFeB}$ = 1.0, 1.5, 2.0, 3.0 nm $t_{MgO}$ = 0.8, 1.2, 1.6 nm

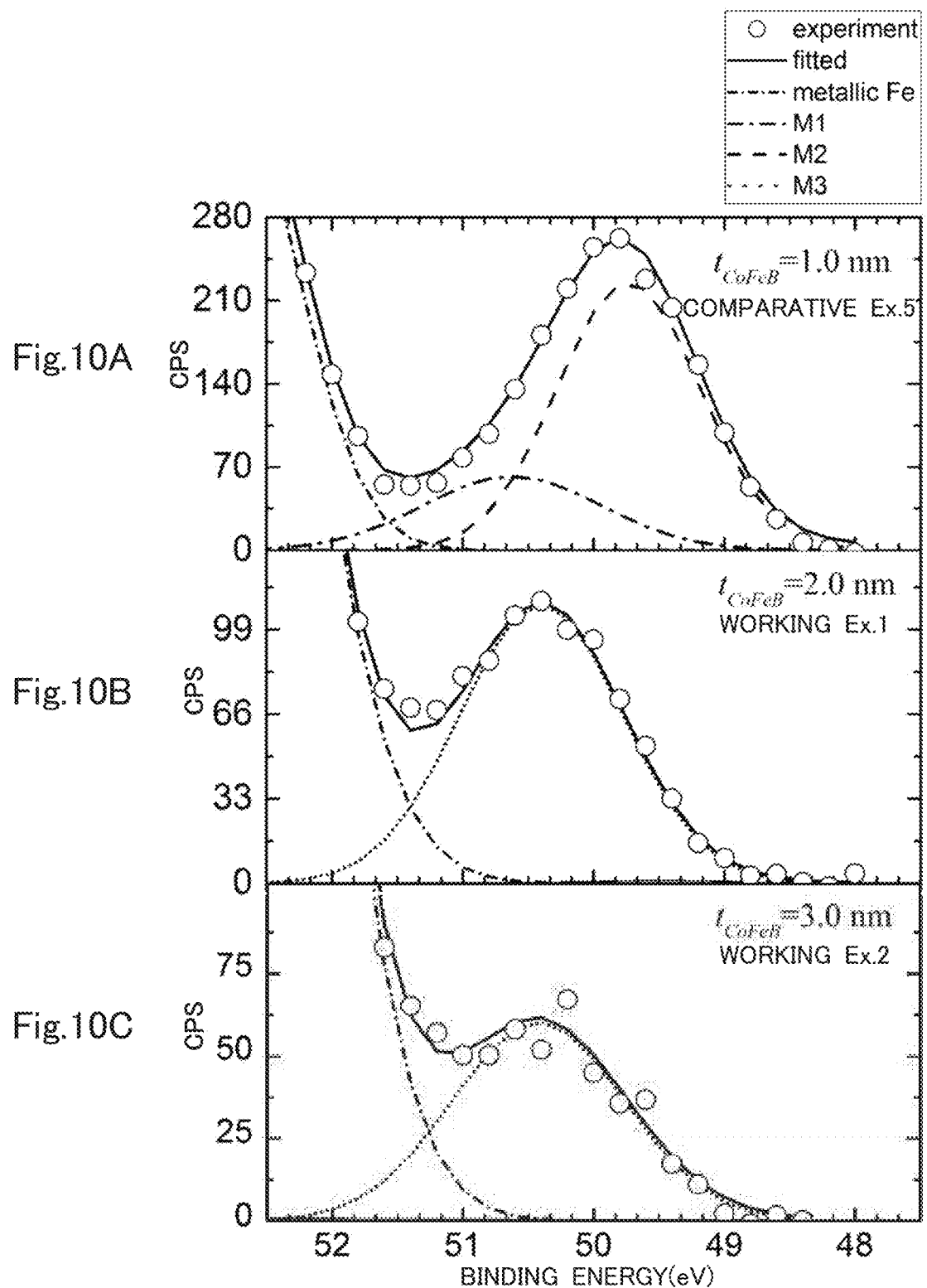

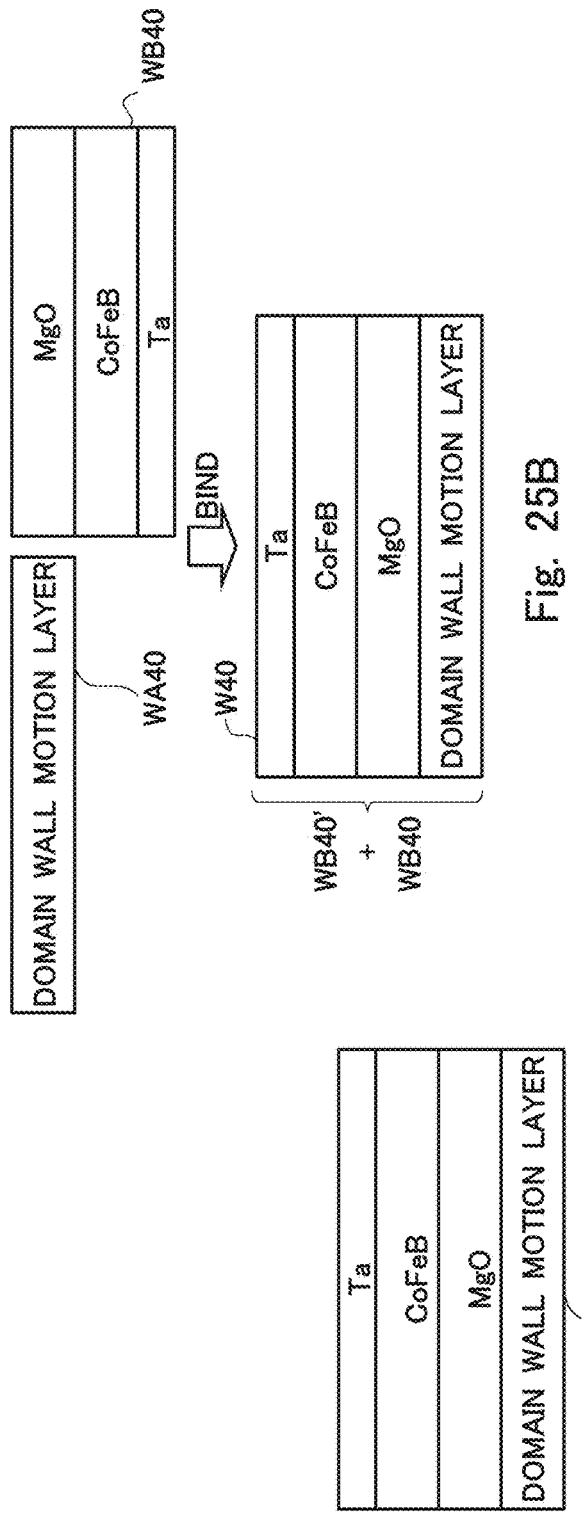
Fig. 25A
Fig. 25B
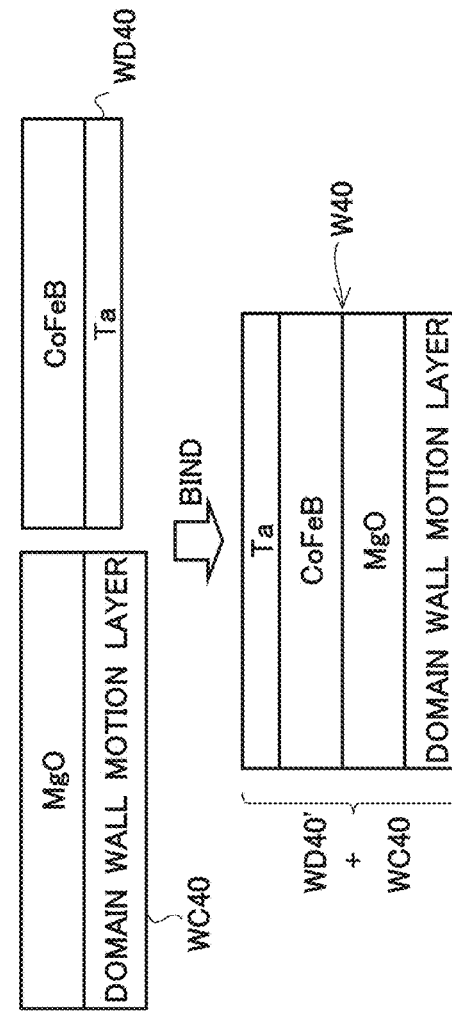
Fig. 25C

SPIN ELECTRONICS ELEMENT AND METHOD OF MANUFACTURING THEREOF

CROSS-REFERENCE TO RELATED APPLICATIONS

This is a division of U.S. application Ser. No. 15/064,586, filed on Mar. 8, 2016, and allowed on Apr. 18, 2019, the entire disclosure of which is incorporated herein by reference.

BACKGROUND OF THE INVENTION

Technical Field

The present invention relates to an spin electronics element and method of manufacturing thereof.

In recent years, among various types of non-volatile memory, a memory using an MTJ (magnetic tunnel junction) element, which is a spintronics element and which is also a resistive recording element, is drawing attention for its high rewriting resistance, high CMOS (complementary metal-oxide semiconductor) compatibility, three-dimensional integration property, and the like.

FIG. 1A shows an MTJ element in a low resistance state, FIG. 1B shows an MTJ element in a high resistance state, and FIG. 1C shows a variable resistance equivalent to the MTJ element. As shown in FIGS. 1A and 1B, the MTJ element (the element labeled "MTJ") includes a free layer FR, a fixed layer FI, and a tunnel barrier TB.

The tunnel barrier TB is made of an insulating thin film such as MgO or $Al_2O_3$. The free layer FR and the fixed layer FI are each made of a ferromagnetic material such as iron, cobalt, or an alloy thereof. The free layer FR has an upper electrode terminal TE, and the fixed layer FI has a lower electrode terminal BE. The magnetic direction of the free layer FR changes in accordance with the flow of electric current through the MTJ element, but the magnetic direction of the fixed layer FI does not change.

As shown in FIG. 1A, when the magnetic direction of the free layer FR and the magnetic direction of the fixed layer FI are the same (parallel), the MTJ element enters the low resistance state. On the other hand, as shown in FIG. 1B, when the magnetic direction of the free layer FR and the magnetic direction of the fixed layer FI are opposite (anti-parallel), the MTJ element enters the high resistance state. In FIGS. 1A and 1B, the magnetic directions of the free layer FR and the fixed layer FI are indicated with the broken arrows.

The low resistance state and the high resistance state of the MTJ element can be switched between each other by applying an appropriate level of current to the MTJ element. When the MTJ element is in the high resistance state as shown in FIG. 1B, by supplying current $I_{mtj}$ flowing from the free layer FR to the fixed layer FI, the MTJ element enters the low resistance state as shown in FIG. 1A. If the current $I_{mtj}$ is supplied when the MTJ element is in the low resistance state, the low resistance state is maintained.

On the other hand, when the MTJ element is in the low resistance state, by supplying current $-I_{mtj}$ flowing from the fixed layer FI to the free layer FR, the MTJ element enters the high resistance state as shown in FIG. 1B. If the current $-I_{mtj}$ is supplied when the MTJ element is in the high resistance state, the high resistance state is maintained. Thus, the MTJ element can be regarded as a variable resistance as shown in FIG. 1C.

By letting the high resistance state represent one of two logical values "0" and "1" and letting the low resistance state represent the other, the MTJ element can function as a recording element. FIG. 2 is a diagram showing the R-I characteristics of the MTJ element. As shown in FIG. 2, the R-I characteristics of the MTJ element exhibit hysteresis, and therefore, the low resistance state and the high resistance state of the MTJ element are maintained even after the supply of current to the MTJ element is stopped. This allows the MTJ element to function as a non-volatile recording element. In FIG. 2, Rp indicates the electrical resistivity of the MTJ element in the low resistance state, and Rap indicates the electrical resistivity in the high resistance state.

The MTJ element can also function as a switching element by letting the low and high resistance states correspond to ON and OFF states, respectively.

Spintronics elements such as the MTJ element are configured to have a ferromagnetic layer, and a non-magnetic layer such as a MgO layer as described above. MgO is hygroscopic, and the following study to characterize the initial current leakage spots in the MgO layer has been conducted: a 1 nm-thick CoFeB film was formed on the MgO layer, and the initial current leakage spots in the MgO layer was evaluated using a scanning probe microscope having a conductive cantilever attached to it (C. Yoshida, et. al, IRPS 2009, p. 139).

However, the present inventors have discovered that the 1 nm-thick CoFeB film formed on the MgO layer does not prevent alteration or degradation of characteristics of a MgO layer. An MgO tunnel insulating film in the spintronics element has a problem in that the characteristics of the film change due to the reaction with not only $CO_2$ but also $H_2O$ when exposed to the atmosphere. In order to solve this problem, the present invention is aiming at providing a spintronics element and a method for its manufacture, in which, even when a wafer having a non-magnetic layer such as a MgO layer at the uppermost layer thereof is exposed to the atmosphere, alteration and/or degradation of characteristics of the non-magnetic layer can be prevented.

SUMMARY OF THE INVENTION

The invention is applied to a method of manufacturing a spintronics element from a plurality of laminated layers, the method including the steps of (a) forming a plurality of laminated layers in first manufacturing equipment, (b) forming a first wafer in the first manufacturing equipment, including applying a protection layer directly on a non-magnetic uppermost layer of the plurality of laminated layers so that the protection layer prevents alteration of characteristics of the uppermost layer, and (c) exposing the first wafer to an atmosphere outside of the first manufacturing equipment, the atmosphere including $H_2O$, a partial pressure of $H_2O$ in the atmosphere being equal to or larger than $10^{-4}$ Pa.

The invention is also applied to a structure used in the formation of a spintronics element, the spintronics element to include a plurality of laminated layers, including a substrate, a plurality of laminated layers formed on the substrate, an uppermost layer of the plurality of laminated layers being a non-magnetic layer containing oxygen, and a protection layer directly formed on the uppermost layer, the protection layer preventing alteration of characteristics of the uppermost layer while exposed in an atmosphere including $H_2O$, a partial pressure of $H_2O$ in the atmosphere being equal to or larger than $10^{-4}$ Pa, no other layer being directly formed on the protection layer.

The invention is also applied to a spintronics element, including an underlayer, and four laminated layers formed by binding at least two wafers, including a first ferromagnetic layer formed on the underlayer, a non-magnetic layer formed on the first ferromagnetic layer, a second ferromagnetic layer formed on the non-magnetic layer, and a cap layer formed on the second ferromagnetic layer, wherein a surface portion of the second ferromagnetic layer directly contacts the cap layer and is free of any layer having no magnetization.

According to the present invention, a protection layer that allows for exposure to the atmosphere is formed on the uppermost layer, which is an MgO layer, for example, to prevent the alteration or degradation of characteristics of the uppermost layer under the protection layer, which broadens horizon of the spintronics element manufacturing process.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIGS. 3B to 3G are diagrams showing the specific configurations of the substrate.

FIGS. 10A to 10C are graphs showing the results of a spectrum analysis of Comparison Example 5 and Working Examples 1 and 2, respectively.

FIGS. 25A, 25B and 25C are diagrams for explaining the manufacture of a magnetic domain wall motion type memory element.

DETAILED DESCRIPTION OF THE INVENTION

Figure 1:
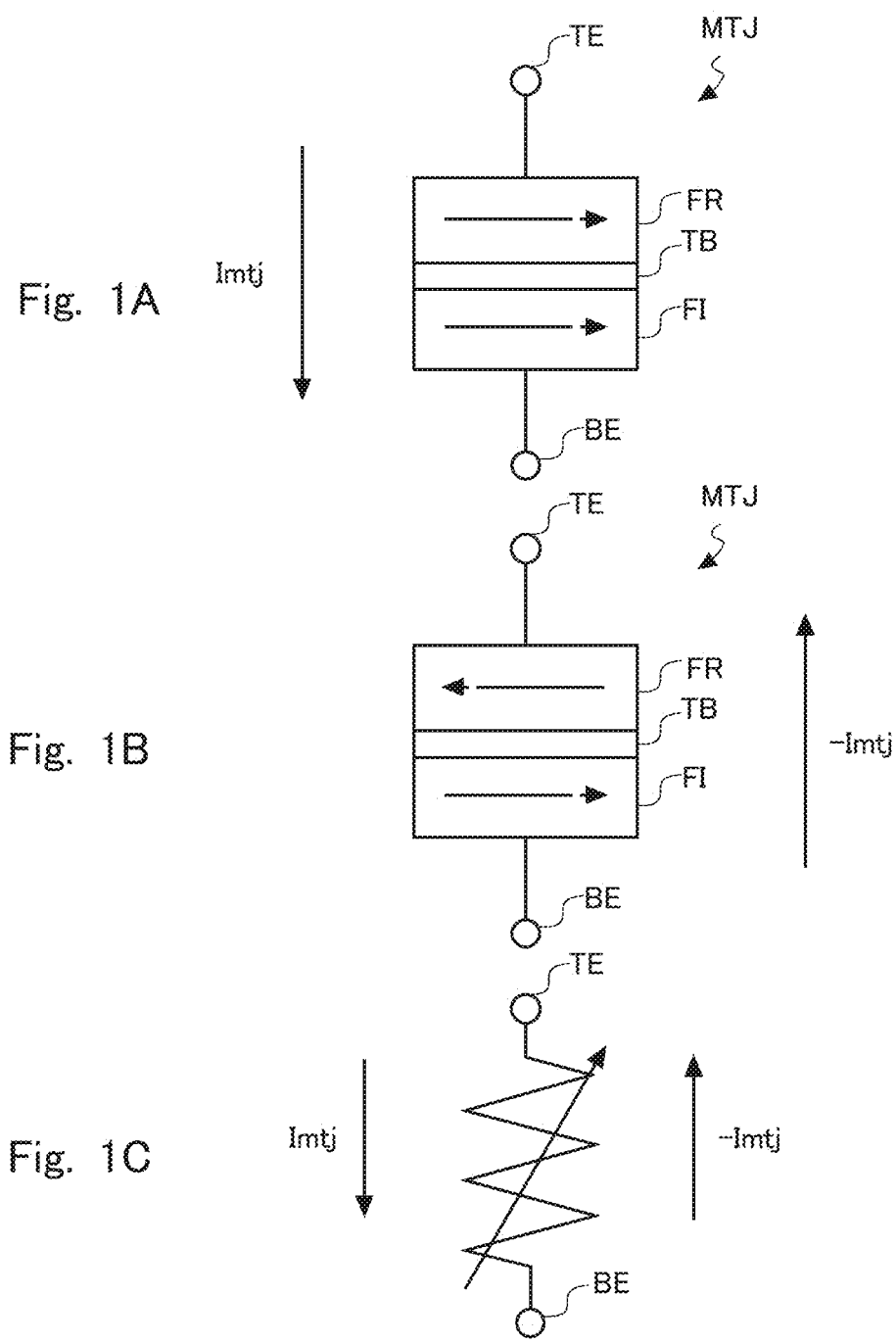
FIG. 1A is a diagram showing an MTJ element in a low resistance state.
FIG. 1B is a diagram showing an MTJ element in a high resistance state.
FIG. 1C is a diagram showing a variable resistance equivalent to the MTJ element.
Figure 2:
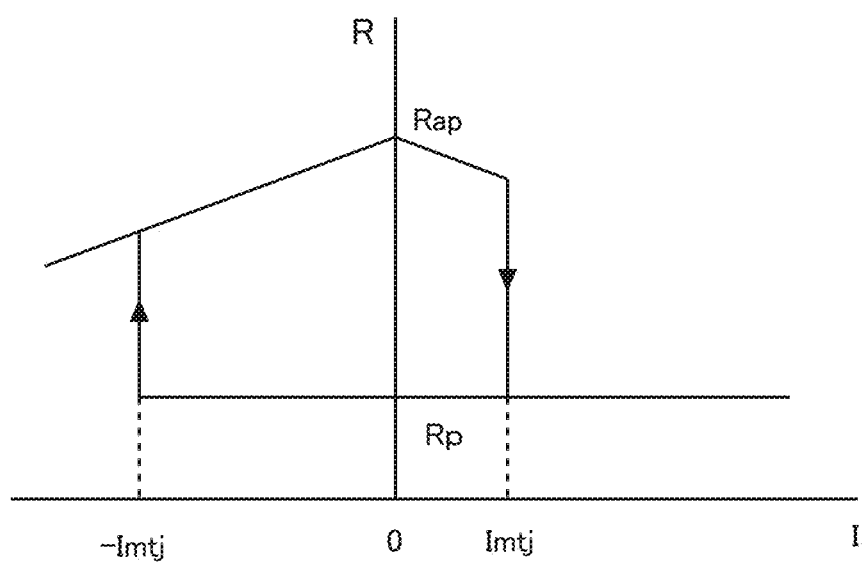
FIG. 2 is a diagram showing the R-I characteristics of the MTJ element.

Hereafter, a description will be given, while referring to the drawings, of an embodiment of the invention. In order to solve the above-mentioned problem, the present inventors have conducted studies resulting in the discovery that when a wafer having a non-magnetic uppermost layer such as MgO layer needs to be exposed to the atmosphere, or in other words, when the wafer needs to be exposed to the atmosphere in which a partial pressure of $H_2O$ is equal to or larger than $10^4$ Pa, by forming a protection layer that prevents alteration or degradation of characteristics of the uppermost layer of the wafer at least immediately before exposing the wafer to the atmosphere, alteration of characteristics of the non-magnetic layer can be prevented even in the above-mentioned atmosphere. In the description below, the non-magnetic layer that has a risk of alteration or degradation of characteristics is an MgO layer, and the protection layer is a CoFeB layer, but the non-magnetic layer that has a risk of alteration or degradation of characteristics is not limited thereto. That is, the protection layer is not limited to a CoFeB layer, but may be made of a material selected from among Co (cobalt), Fe (iron), CoB, FeB, and CoFeB. The protection layer may be a layer that contains at least one of Co, Fe and B (boron), and at least one of Ni (nickel), Zr (zirconium), Hf (hafnium), Ta (tantalum), Mo (molybdenum), Nb (niobium), Pt (platinum), Cr (chromium), Si (silicon), and V (vanadium).

Exemplary Embodiment 1

Figure 3A:
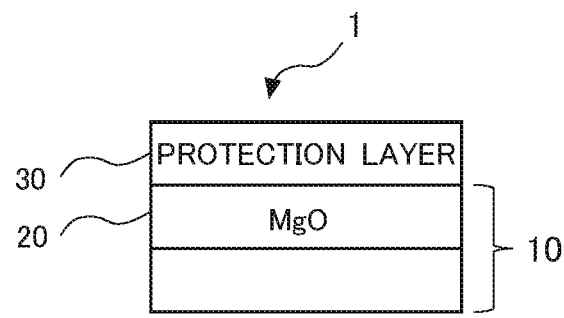
FIG. 3A is a diagram showing a substrate of a spintronics element.

First, a spintronics element of an exemplary embodiment 1 of the invention will be explained. Examples of the spintronics element include a magnetic head used for a magnetic disc, but not limited thereto. FIG. 3A shows a spintronics element substrate 1 of exemplary embodiment 1. In this specification, the spintronics element substrate 1 encompasses all of the following: the substrate in the process of manufacturing the spintronics element, the substrate after the manufacturing process; and the substrate having the protection layer of the exemplary embodiment 1 formed thereon in the process of manufacturing the spintronics element.

As shown in FIG. 3A, the spintronics element substrate 1 includes an MTJ (magnetic tunnel junction) element layer 10 made of two or more laminated layers, and a protection layer 30 made of CoFeB or the like. At the uppermost layer of the element layer 10, or in other words, the uppermost layer on which the protection layer 30 is formed, a non-magnetic layer 20 made of MgO or the like is formed. That is, the spintronics element substrate 1 of the exemplary embodiment 1 has a structure in which laminated layers at least including a ferromagnetic layer and a non-magnetic uppermost layer 20 are formed on a substrate that is not shown in the figure, and on this non-magnetic uppermost layer 20, the protection layer 30 is formed. In this specification, the non-magnetic layer 20 is also be referred to more specifically as MgO layer 20. However, the non-magnetic layer 20 is not limited to an MgO layer, and may be any non-magnetic layer containing at least oxygen. It is preferable that the non-magnetic layer contain oxygen and Mg. The element layer 10 may also have another structure such as a stack structure in which an underlayer made of Ta or the like is formed on a substrate, and a ferromagnetic layer and a non-magnetic layer are laminated thereon, or a structure in which an active element such as a CMOSFET is formed on a Si substrate, and interconnect layers or the like for connecting the active element to the MTJ element are formed thereon.

Interfacial magnetic anisotropy perpendicular to the plane of the layers at the non-magnetic layer and the ferromagnetic layer interface occurs by controlling the temperatures of the annealing process and the thickness of the ferromagnetic layer, and is able to orient the magnetization of the ferromagnetic layer in a direction perpendicular to a plane of the layers (film plane). The annealing temperature may differ from materials in the ferromagnetic layer that contains at least one type of other 3d transition metal, such as CoFe or Fe. The magnetization direction can be changed from being parallel to perpendicular with respect to the plane of the layers by suitably controlling the film thickness for the material. The cause of the magnetization direction becoming perpendicular to the film plane is due to the interfacial perpendicular magnetic anisotropy at the interface of the non-magnetic layer and the ferromagnetic layer. By forming a thin layer by controlling the thickness of the ferromagnetic layer on an atomic layer level, the ratio of volume in which the interfacial perpendicular magnetic anisotropy is present relative to the volume of the ferromagnetic layer can be increased. Thus, the interfacial perpendicular magnetic anisotropy at the interface between the ferromagnetic layer and the non-magnetic layer becomes pronounced such that the magnetization direction becomes perpendicular to the plane of the layers. The effect is particularly increased at the interface between an oxygen-containing compound represented by MgO, $Al_2O_3$, $SiO_2$, or the like, and a ferromagnetic material containing at least one type of 3d transition metal, such as Co or Fe, whereby the magnetization tends to be more easily oriented in the direction perpendicular to the plane of the layers. The interfacial magnetic anisotropy perpendicular to the plane of the layers at the non-magnetic layer and the ferromagnetic layer interface is explained in the disclosures of U.S. Pat. Nos. 8,917,541, 9,153,306, and 9,202,545, which are incorporated herein by references.

Figure 3B:
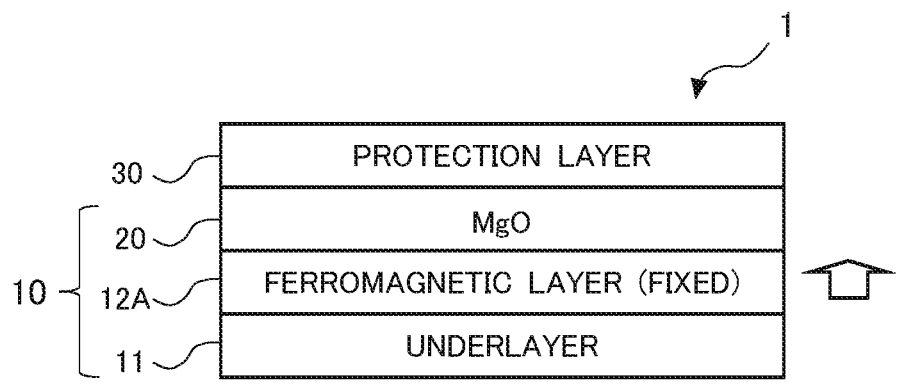
Figure 3C:
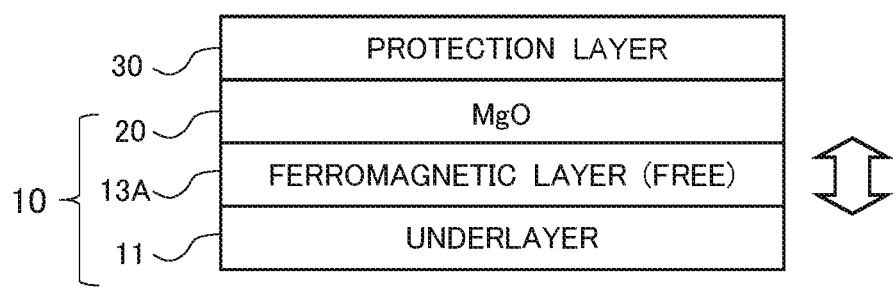

FIGS. 3B to 3G are diagrams showing specific configurations of the spintronics element substrate 1. As shown in FIG. 3B, the spintronics element substrate 1, for example, has an element layer 10 in which an underlayer 11, a ferromagnetic layer (fixed layer) 12A, and an MgO layer 20 are laminated in this order on a substrate such as an Si substrate, which is not shown in the figure, and on this element layer 10, a protection layer 30 is formed. The ferromagnetic layer (fixed layer) 12A is configured such that its magnetic direction is fixed in the direction perpendicular to the surface of the layer (upward or downward). As shown in FIG. 3C, the ferromagnetic layer (free layer) 13A may also be formed on the underlayer 11. The ferromagnetic layer (free layer) 13A is configured such that its magnetic direction is not fixed to either the upward or downward direction. The protection layer 30 is preferably made of the same material as that of the layer immediately below the uppermost layer of the element layer 10, namely, the ferromagnetic layer 12A in the example of FIG. 3B. If the ferromagnetic layer 12A is a CoFeB layer, for example, it is preferable that the protective layer 30 be also a CoFeB layer. When the protection layer 30 is made of CoFeB, it is preferable that its thickness be equal to or greater than 2 nm as described below.

Alternatively, as shown in FIG. 3D, the spintronics element substrate 1 may have a structure in which an element layer 10 is formed by laminating an underlayer 11, a fixed layer 14 (ferromagnetic layer 14A, a non-magnetic binding layer 14B, and a ferromagnetic layer 14C), and an MgO layer 20 in this order, and on this element layer 10, a protection layer 30 is formed. The ferromagnetic layer 14A and the ferromagnetic layer 14C are each configured such that its magnetic direction is fixed to the perpendicular direction (upward or downward). The non-magnetic binding layer 14B is a Ta layer, for example. The non-magnetic binding layer 14B may be a layer made of W (tungsten), Hf, Zr, Nb, Mo, Ti (titanium), Mg (magnesium), MgO, or the like. Alternatively, as shown in FIG. 3E, the spintronics element substrate 1 may have a structure in which an element layer 10 is formed by laminating an underlayer 11, a fixed layer 14 (ferromagnetic layer 14D, a non-magnetic binding layer 14B, and a ferromagnetic layer 14C), and an MgO layer 20 in this order, and on this element layer 10, a protection layer 30 is formed. The ferromagnetic layer 14D is configured such that its magnetic direction is fixed to be the downward perpendicular direction, and the ferromagnetic layer 14C is configured such that its magnetic direction is fixed to the upward perpendicular direction. Alternatively, as shown in FIG. 3F, the spintronics element substrate 1 may have a structure in which an element layer 10 is formed by laminating an underlayer 11, a free layer 15 (ferromagnetic layer 15D, a non-magnetic binding layer 15B, and a ferromagnetic layer 15C), and an MgO layer 20 in this order, and on this element layer 10, a protection layer 30 is formed. The ferromagnetic layers 15C and 15D are each configured to have a magnetic direction that is not fixed to either the upward or downward perpendicular direction. Alternatively, as shown in FIG. 3G, the spintronics element substrate 1 may have a structure in which an element layer 10 is formed by laminating a magnetic domain wall motion layer 16 and an MgO layer 20, and on this element layer 10, a protection layer 30 is formed. The configurations described above are examples of the spintronics element substrate 1, and those configurations may be combined with each other.

As described above, in the exemplary embodiment 1, in a process of manufacturing the spintronics elements in which the uppermost layer is a non-magnetic layer made of a material such as MgO that changes in quality or degrades in an environment containing $H_2O$, $CO_2$, or the like, a protection layer that prevents alteration or degradation of characteristics of the non-magnetic uppermost layer is formed, making it possible to suppress the alteration or degradation of characteristics of the non-magnetic uppermost layer even when the element is exposed to the atmosphere containing $H_2O$, $CO_2$, and the like. This allows various processes to be conducted that would significantly degrade the characteristics of the spintronics element if it weren't for the protection layer.

Exemplary Embodiment 2

Next, an exemplary embodiment 2 will be explained. The spintronics element substrate 1 used for a magnetic resistive memory element, magnetic sensor, or the like is exposed to the atmosphere, for example, during an inspection process of or after the manufacturing process. It may be in the middle of the manufacturing process in some cases, but as described above, the MgO layer 20 changes in quality by absorbing $H_2O$ and/or by reacting with $CO_2$ in the atmosphere. Thus, if the spintronics element substrate 1 having the MgO layer 20 formed at its uppermost layer is exposed to the atmosphere, the characteristics of the MgO layer 20 would change. In the exemplary embodiment 2, however, the protection layer 30 is formed on the MgO layer 20 to prevent degradation or alteration of characteristics of the MgO layer 20, and therefore, it is possible to conduct an inspection process or the like. In the exemplary embodiment 2 described below, a case where a product inspection is conducted during the manufacturing process will be explained.

As shown in FIG. 3B described above, in this example, the ferromagnetic layer 12A immediately below the MgO layer 20 is a CoFeB layer, and the protection layer is made of the same CoFeB material. CoFeB/MgO perpendicular magnetic tunnel junction (p-MTJ) is a promising building block of next generation non-volatile memory integrated in VLSI (T. Endoh, et al., VLSI Tech. Symp., p. 89, 2012, S. Ikeda, et al., Nat. Mater., vol. 9, p. 721, 2010). Thus, evaluating the current leak spot density distributed in the plane of the MgO layer 20 formed in the element layer 10 shown in FIG. 3B, for example, is very important in terms of evaluating the reliability of the spintronics element such as a magnetic tunnel junction element in which the MgO layer 20 functions as a tunnel insulating layer.

Figure 4:
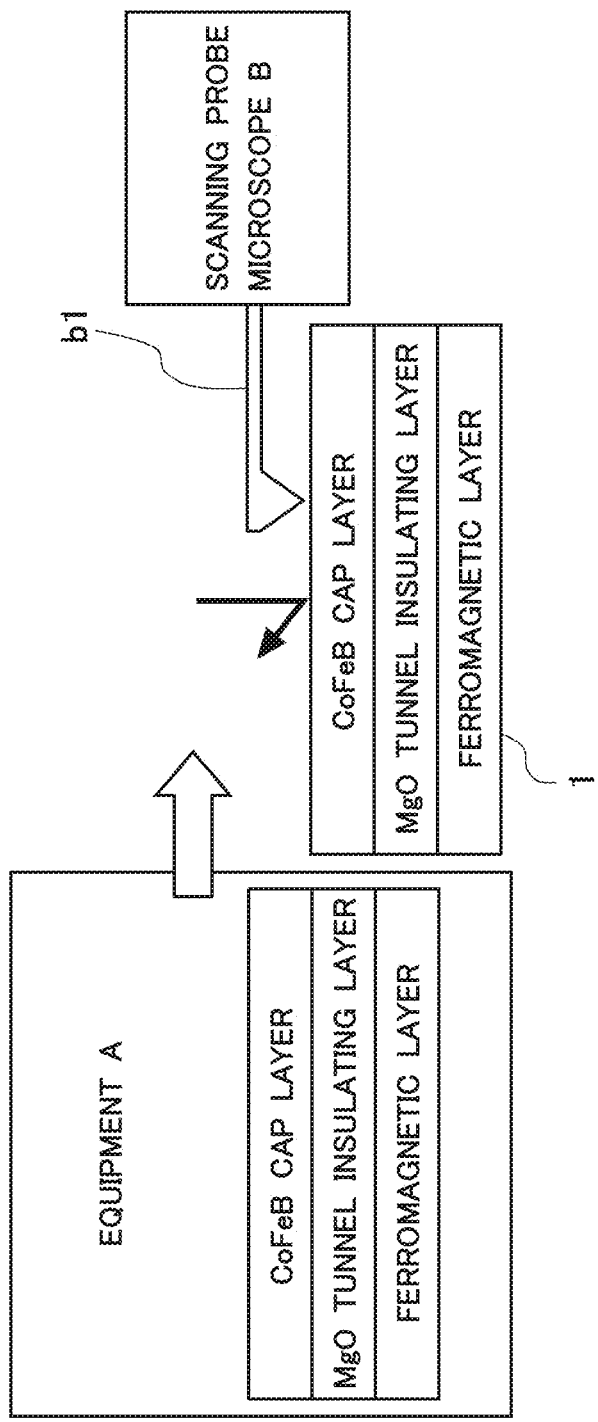
FIG. 4 is a schematic diagram for explaining a method of evaluation using a scanning probe microscope (SPM).

As a specific example of the product inspection, evaluation on the spintronics element substrate 1 by the conductive AFM (atomic force microscopy) method using a conductive cantilever will be explained. A characterization of these leakage spots in an MgO tunneling barrier by means of conductive atomic force microscopy (c-AFM) provides useful information for accurate modeling of p-MTJ (C. Yoshida, et. al, IRPS, p. 139, 2009). FIG. 4 is a schematic diagram for explaining the method of evaluation using a scanning probe microscope (SPM). The AFM device will be explained below. AFM is one type of scanning probe microscopes, and by scanning the surface of the spintronics element substrate 1 with a sharp end of a probe (conductive cantilever b1), and by converting the atomic force detected by the probe to an electric signal, the surface profile can be measured.

As shown in FIG. 4, the film forming equipment A and the scanning probe microscope equipment B are generally provided as separate pieces of equipment. This means that the spintronics element substrate 1 needs to be moved out from a chamber of the film forming equipment A, and the spintronics element substrate 1 is thereby exposed to the outside atmosphere. Thus, for example, when the leak spot density of the MgO layer is to be tested for the product inspection in the middle of the MTJ film forming process, for example, because the film forming equipment A where the spintronics element substrate 1 is formed, and the scanning probe microscope equipment B are separate pieces of equipment, the spintronics element substrate 1 needs to be transferred from one to the other, which causes the spintronics element substrate 1 to be exposed to the atmosphere.

A study shows that the leak spot density of such a spintronics element substrate increases between the 5-minute mark and the 15-minute mark after the exposure to the atmosphere (K. M. Bhutta, Ph. D, Thesis in Physics, Fakultät für Physik, Universitat Bielefeld, 2009), and the alteration of characteristics of the MgO layer 20 in the atmosphere is considered to have affected the measurement of the leak spot density.

Even if a nitrogen gas substitution device such a glovebox is installed in the transfer path of a sample, it is not possible to completely eliminate $H_2O$. Because MgO absorbs moisture even in an atmosphere in which a partial pressure of $H_2O$ is $10^4$ Pa (E. Carrasco, et. al, J. Phys. Chem. C 114, 18207 (2010)), the above-mentioned problem remains a universal problem.

Furthermore, even if an environment-controlled SPM (which allows for a vacuum state of the probe chamber or a change in atmospheric gas in the probe chamber) is used, a sample is still exposed to the outside atmosphere on the way to the environment-controlled SPM. Special equipment in which the film forming equipment and the SPM equipment are connected to each other via a transfer chamber that maintains ultra-high vacuum state may be configured, but the equipment size and cost would increase.

In the exemplary embodiment, however, the protection layer 30 is formed on the MgO layer 20, which is the uppermost layer of the element layer 10, and therefore, it is possible to prevent alteration and degradation of characteristics of the MgO layer 20. As a result, the current leak spot density on the MgO layer 20 can be accurately evaluated. The protection layer 30 has the function of preventing alteration of characteristics of the MgO layer 20 even if the spintronics element substrate 1 is exposed to an atmosphere in which a partial pressure of $H_2O$ is equal to or greater than $10^{-4}$ Pa.

The present inventors have discovered the following facts using X-ray photoelectron spectroscopy. That is, in a case of forming a CoFeB film 30 as the protection layer on the MgO layer 20, in order to prevent alteration of characteristics of the MgO layer 20 caused by reaction with $H_2O$ or $CO_2$ in the atmosphere:

(1) the protection layer needs to be 1 nm or greater in thickness to prevent the reaction with $CO_2$ in the atmosphere; and (2) the protection layer needs to be 2 nm or greater in thickness to prevent the reaction with $H_2O$ in the atmosphere.

Figure 5:
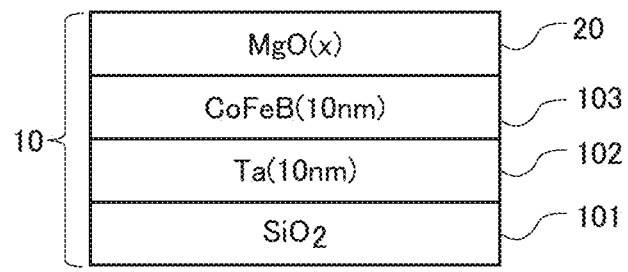
FIG. 5 is a diagram showing a comparison example in which a protection layer is not formed on the uppermost layer of the element layer.
Figure 6A:
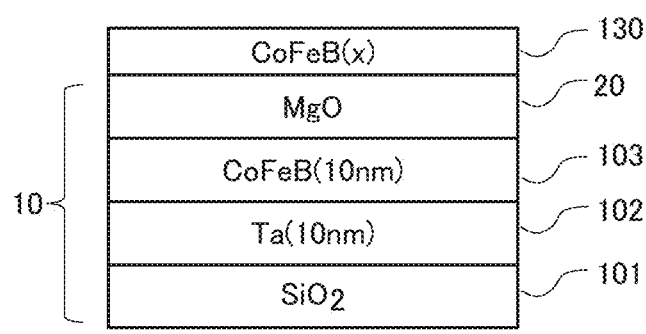
FIGS. 6A and 6B are diagrams schematically illustrating respective samples B and C that were prepared, each having a stack structure.
Figure 6B:
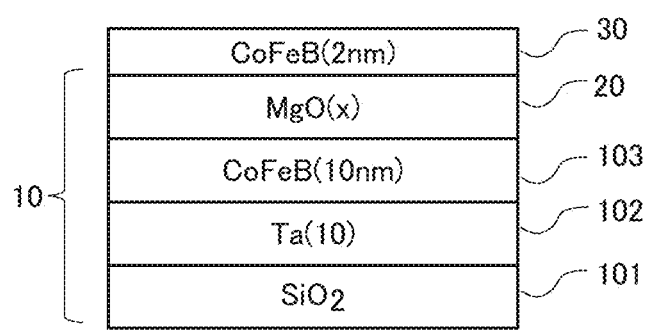

The reasons thereof will be explained next. As shown in FIGS. 5, 6A, and 6B, three samples A, B, and C each having a stack structure were prepared. Sample A shown in FIG. 5 is an example (comparison example) in which a protection layer is not formed on the uppermost layer of the element layer. In each spintronics element substrate, an $SiO_2$ substrate 101, a 10 nm-thick Ta layer 102 as a non-magnetic layer, a 10 nm-thick CoFeB layer 103, and an MgO(x) layer 20 with the thickness $t_{MgO}$ being 0.4, 0.8, 1.2, or 3.0 nm are formed in this order. That is, four different samples (will be referred to below as Comparison Examples 1 to 4) in which the thicknesses of MgO(x) layer 20 differ from each other were prepared.

Sample B shown in FIG. 6A includes an MgO layer 20 of the same thickness $t_{MgO}$ (1.2 nm) (hereinafter referred to as MgO (1.2 nm)), and on top of that, a CoFeB(x) layer 130 with the thickness $t_{CoFeB}$ being either 1.0, 1.5, 2.0, or 3.0 nm is formed as the protection layer. The sample in which the thickness $t_{CoFeB}$ of the CoFeB(x) layer 130 (protection layer) is 1.0 nm is Comparison Example 5, the sample in which the thickness $t_{CoFeB}$ of the CoFeB(x) layer 130 (protection layer) is 1.5 nm is Comparison Example 6, the sample in which the thickness $t_{CoFeB}$ of the CoFeB(x) layer 130 (protection layer) is 2.0 nm is Working Example 1, and the sample in which the thickness $t_{CoFeB}$ of the CoFeB(x) layer 130 (protection layer) is 3.0 nm is Working Example 2.

In Sample C shown in FIG. 6B, the thickness of the CoFeB layer, which is the protection layer 30, is fixed to 2 nm, and the thickness $t_{MgO}$ of the MgO(x) layer 20 is either 0.8, 1.2, or 1.6 nm. The respective samples with the thickness $t_{MgO}$ of the MgO(x) layer 20 being 0.8, 1.2, and 1.6 nm are Working Example 3, 4, and 5, respectively (see Table 1).

TABLE 1

| | Layers | | | | |
|---|---|---|---|---|---|
| sample | CoFeB (10 nm) | MgO(x) $t_{MgO}$ | CoFeB(x) $t_{CoFeB}$ | Reaction with $CO_2$ | Reaction with $H_2O$ |
| Comparative Ex. 1 | 10 nm | 0.4 nm | N/A | Positive | Positive |
| Comparative Ex. 2 | | 0.8 nm | N/A | Positive | Positive |
| Comparative Ex. 3 | | 1.2 nm | N/A | Positive | Positive |
| Comparative Ex. 4 | | 3.0 nm | N/A | Positive | Positive |
| Comparative Ex. 5 | | 1.2 nm | 1.0 nm | Negative | Positive |
| Comparative Ex. 6 | | 1.2 nm | 1.5 nm | Negative | Positive |
| Example 1 | | 1.2 nm | 2.0 nm | Negative | Negative |
| Example 2 | | 1.2 nm | 3.0 nm | Negative | Negative |
| Example 3 | | 0.8 nm | 2.0 nm | Negative | Negative |
| Example 4 | | 1.2 nm | 2.0 nm | Negative | Negative |
| Example 5 | | 1.6 nm | 2.0 nm | Negative | Negative |

Figure 7:
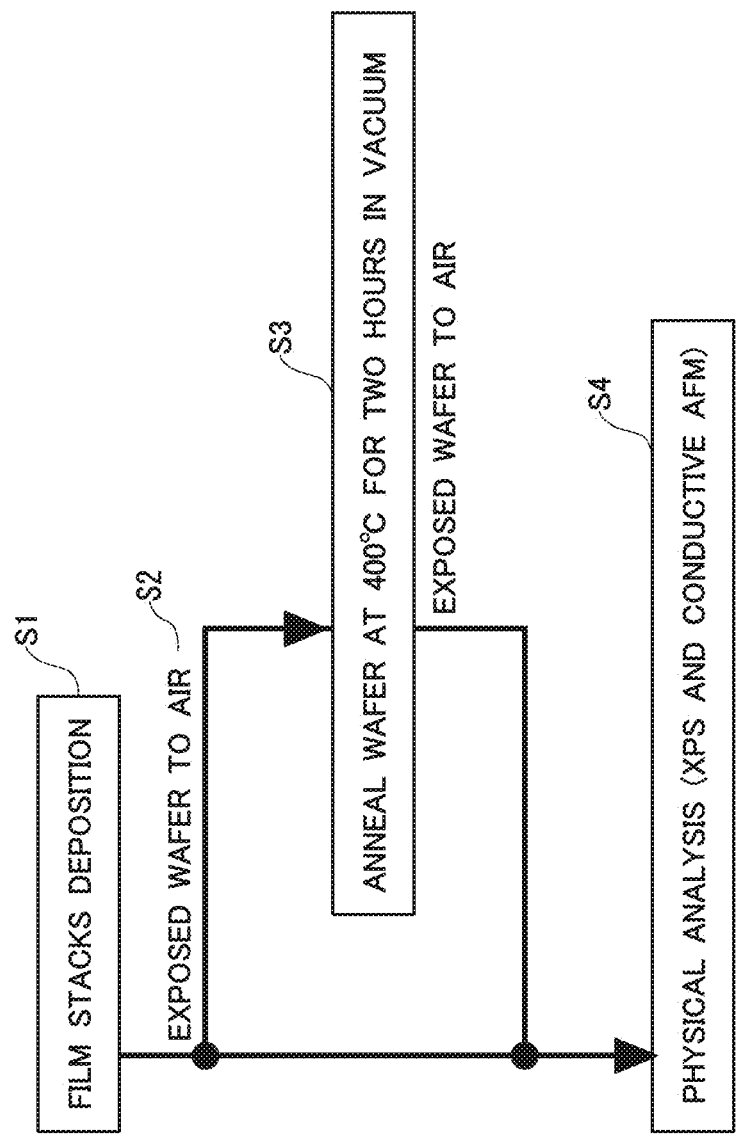
FIG. 7 is a flowchart showing the method of manufacturing the samples.

FIG. 7 is a flowchart showing the method of manufacturing the samples. As shown in FIG. 7, the samples of working examples and comparison examples shown in the figures were formed by magnetron sputtering on thermally grown $SiO_2$ film at room temperature (Step 1). Thereafter, these samples were exposed to the atmosphere in a clean room for two days or longer to obtain the equilibrium of the surface reaction, for example, the surface oxidation and the moisture absorption (Step 2). Then, the samples were annealed at 400 degrees for two hours in vacuum (Step S3). For the c-AFM measurement, the cleaved samples were fixed on a metal plate, and conductive paste was on the cleaved edge of the sample and the plate. A positive bias voltage was applied to the plate during the c-AFM measurement. Another cleaved sample was subjected to X-ray photoelectron spectroscopic (XPS) analysis using Al Kα radiation (Step S4).

The test conditions may be described as follows.
Angle resolved X-ray Photoelectron Spectroscopy (XPS)
Al Kα radiation (hv=1486.6 eV)
Take-off angles=30°, 45°, and 72°.
Charge neutralizer was used.
Conductive AFM
A PPP-EFM tip coated with PtIr (R=25 nm) was used.
The tip was grounded, and the positive bias voltage was applied to the bottom electrode of the samples.

<MgO and $CO_2$ Reaction>

Figures 8A, 8B, 8C:
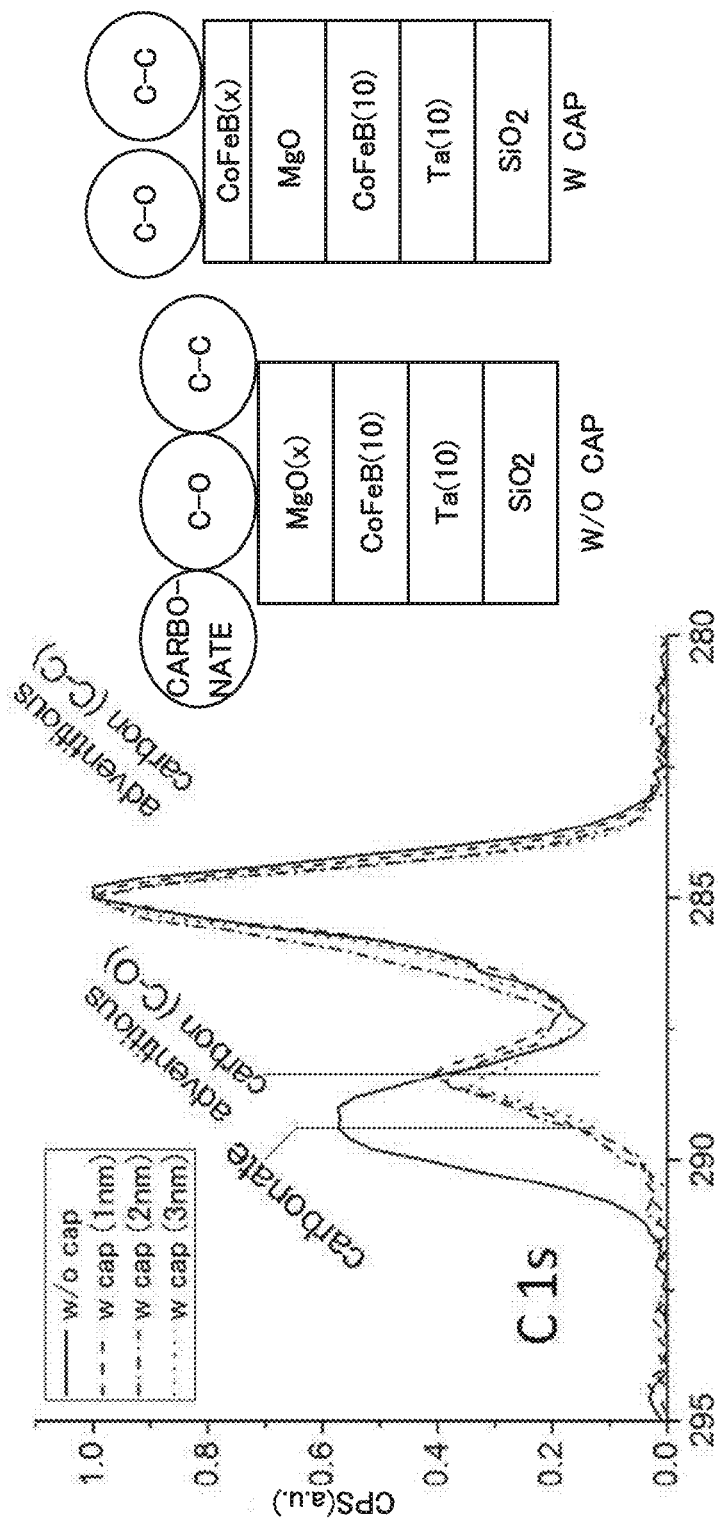
FIG. 8A is a graph showing the results of an X-ray photoelectron spectroscopic (XPS) analysis of the surfaces of samples having a CoFeB protection layer, and samples not having a CoFeB protection layer.
FIGS. 8B and 8C are schematic diagrams of samples without and with the protection layer.

FIG. 8 is a graph showing the results of XPS evaluation of the surfaces of samples having a CoFeB protection layer (Comparison Example 5, Working Examples 1 and 2), and samples not having a CoFeB protection layer (Comparison Example 2: MgO layer is 0.8 nm thick). FIG. 8 shows that Comparison Example 2, i.e., the sample with no protection layer, exhibits a characteristic peak in the carbonate bonding (J. F. Moulder, P. E. Sobol, and K. D. Bomben, Handbook of X-ray Photoelectron Spectroscopy (Physical Electronics, 1995), p. 40-41). On the other hand, in Comparison Example 5, Working Example 1 or 2 in which the protection layer was formed to be 1, 2, and 3 nm, carbonate was not confirmed. When MgO reacts with $CO_2$ in the atmosphere, $MgCO_3$ is formed (Y. Yanagisawa, et al., J. Phys. Chem. 99, 3704 (1995)), and therefore, this result shows that it is possible to suppress the reaction between MgO and $CO_2$ by the formation of a 1 nm-thick protection layer.

<$H_2O$ and MgO Reaction>

Figure 9A:
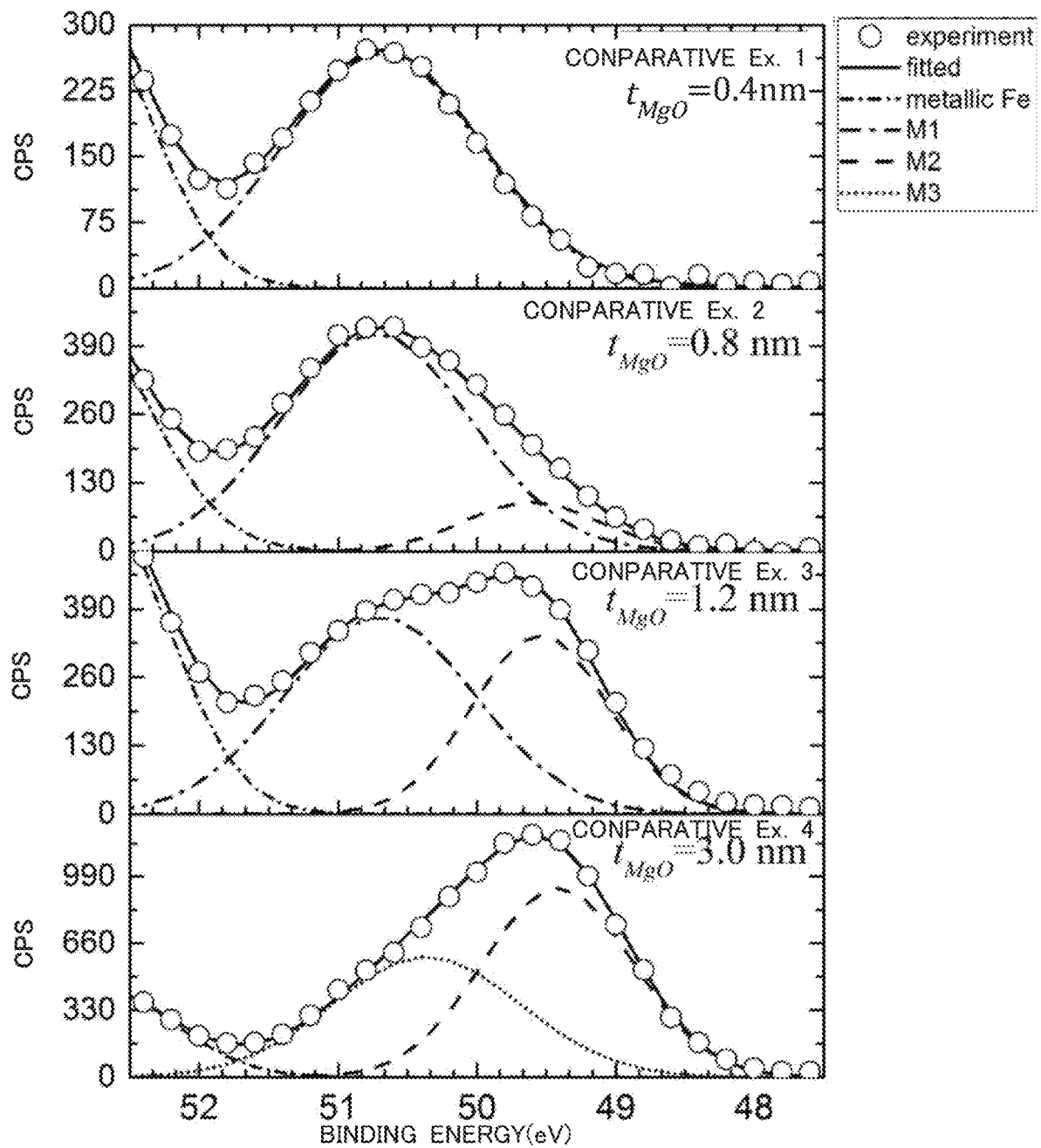
FIG. 9A is a graph showing the results of an XPS analysis of the surface of the MgO layer in the comparison examples without a protection layer in which each MgO layer has a different thickness.
Figure 9B:
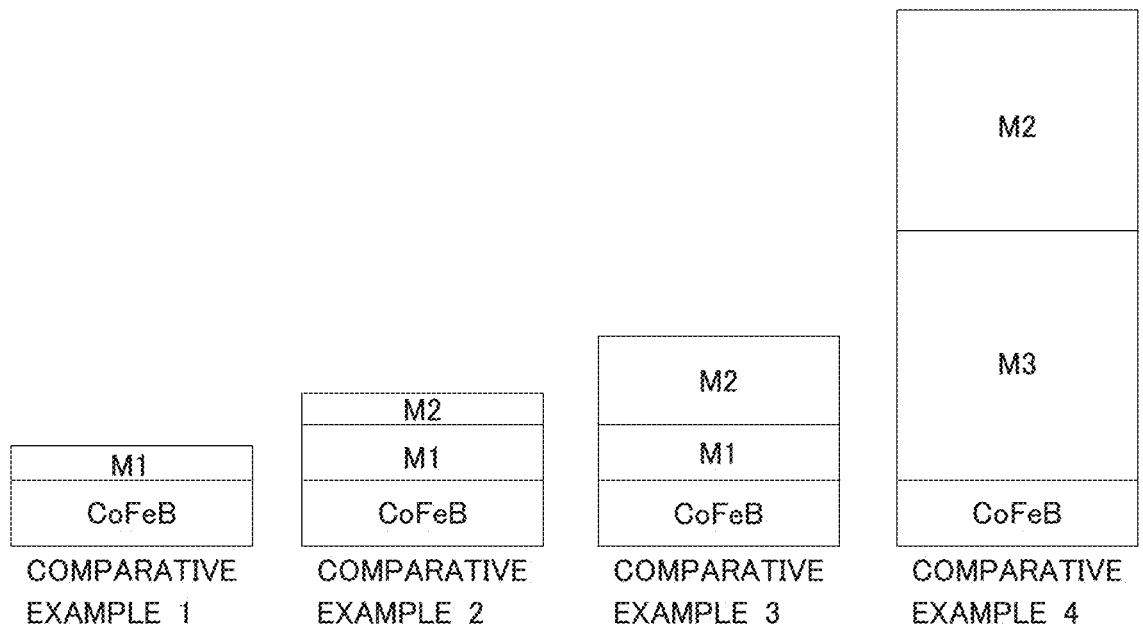
FIG. 9B is schematic diagrams of the comparison examples.
Figure 11A:
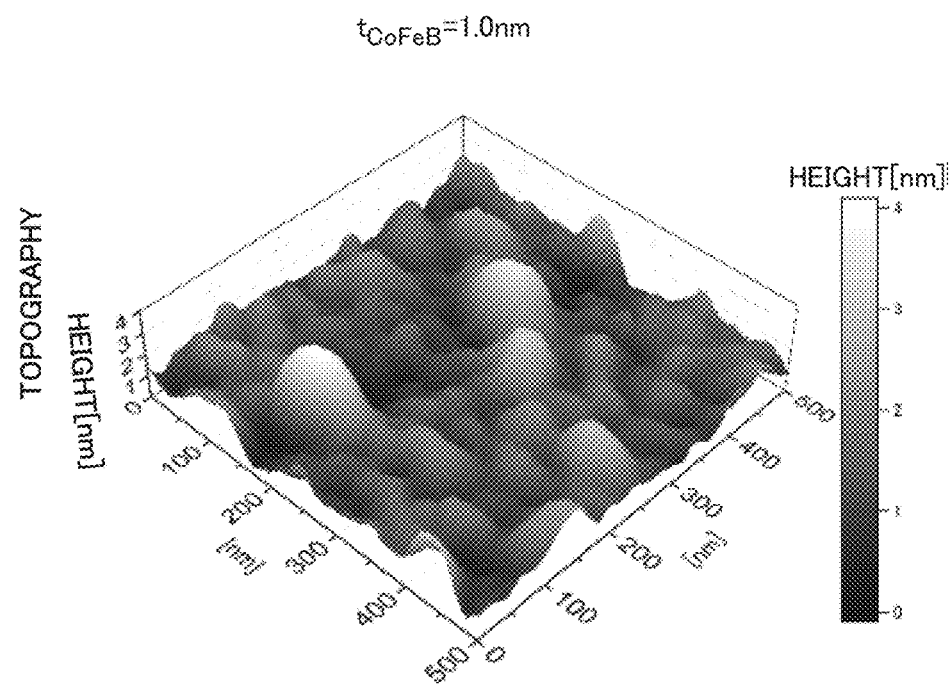
FIGS. 11A and 11B, FIGS. 12A and 12B, FIGS. 13A and 13B, and FIGS. 14A and 14B show the topography and current of Comparison Examples 5 and 6, and Working Examples 1 and 2, each having a CoFeB protection layer, that underwent annealing at 400 degrees and were subjected to a conductive AFM evaluation, respectively.
Figure 11B:
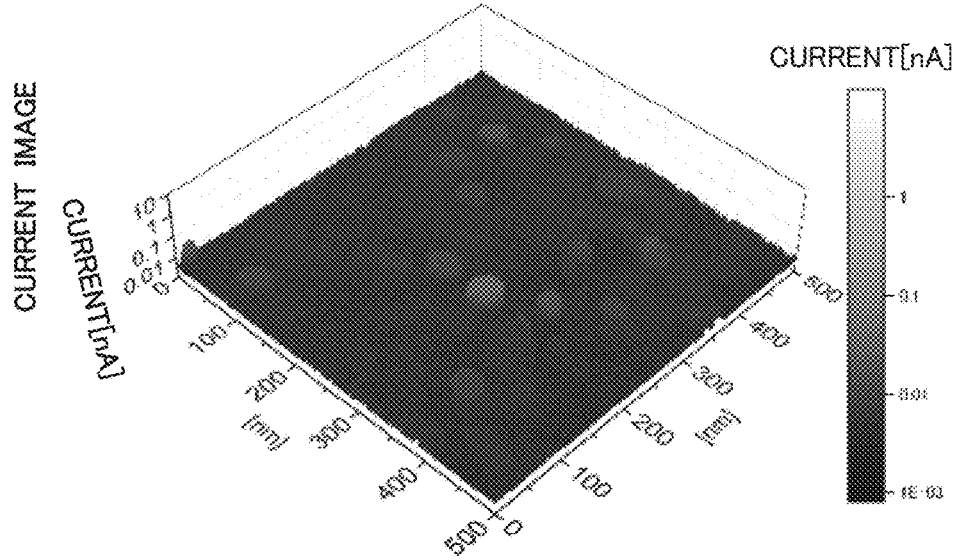
Figures 12A, 12B:
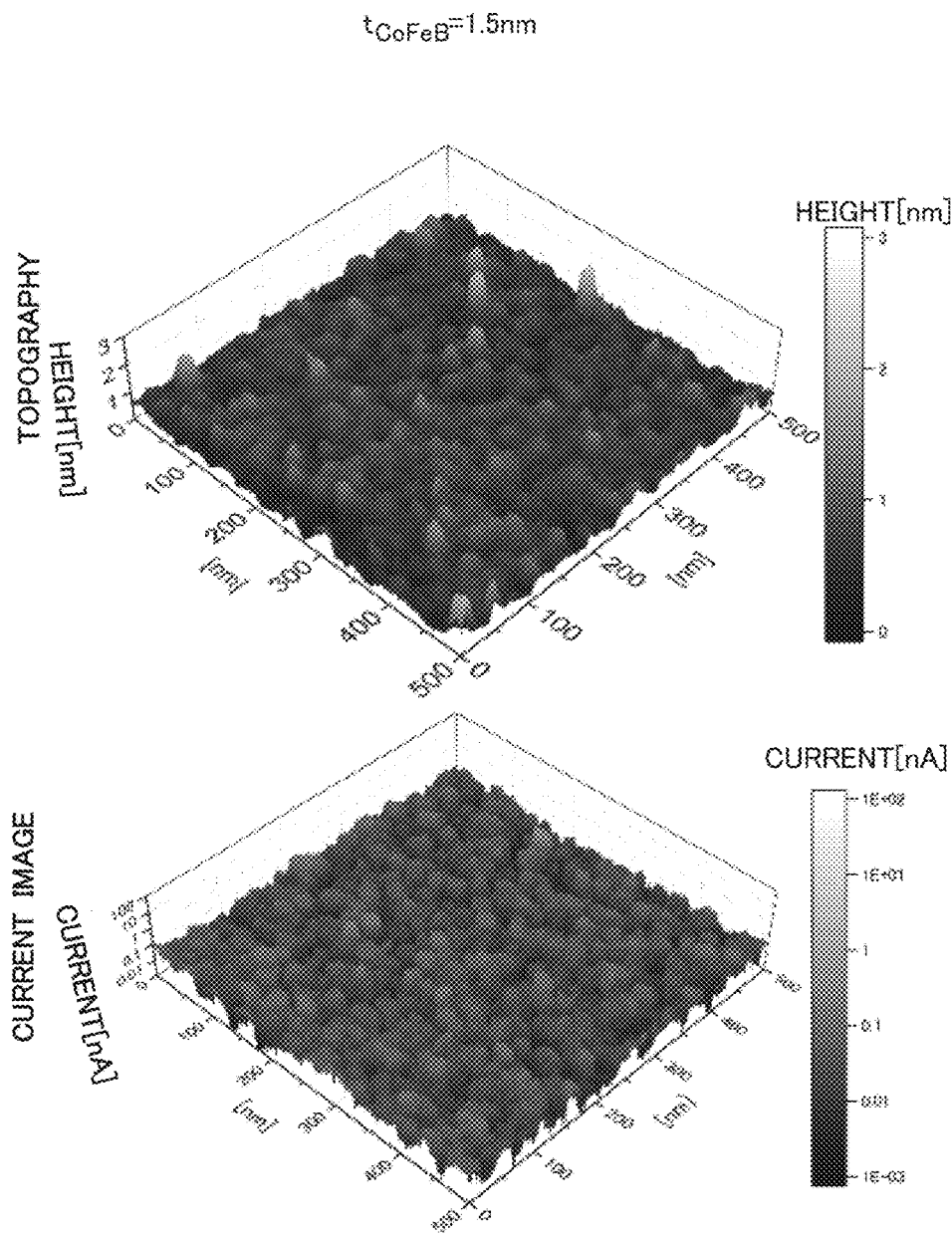
Figure 13A:
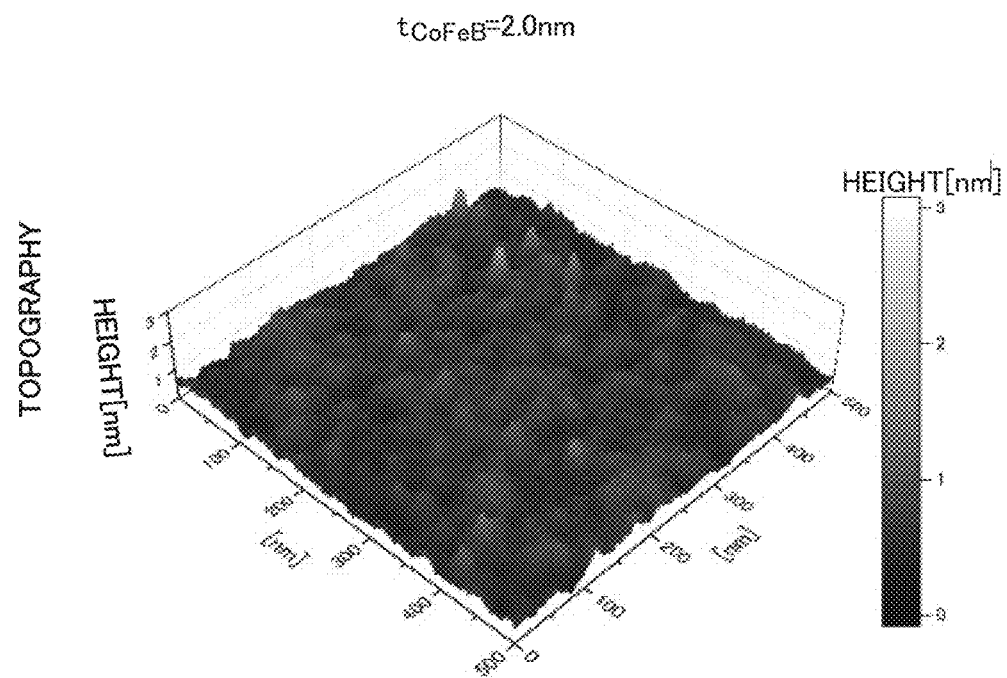
Figure 13B:
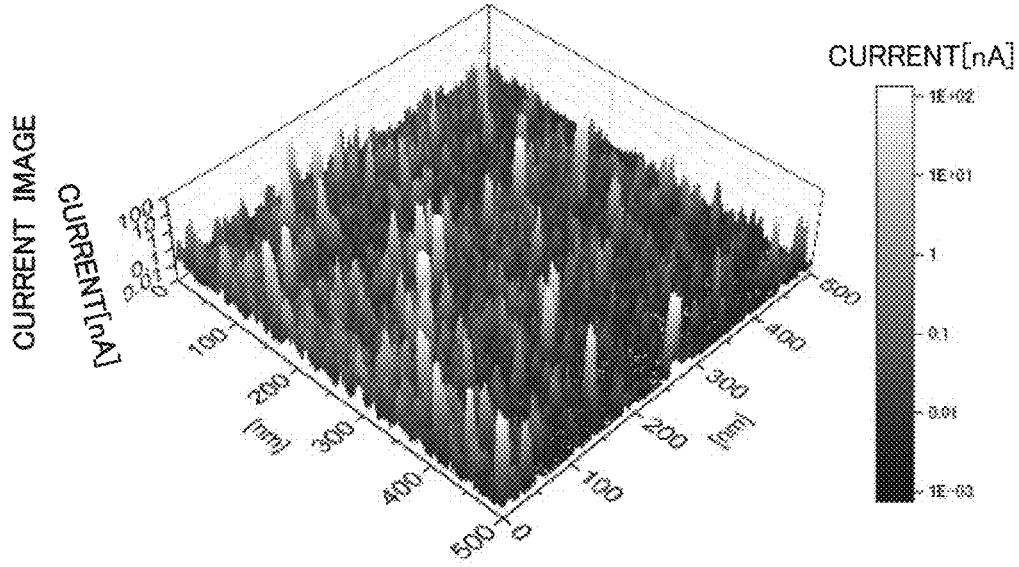
Figure 14A:
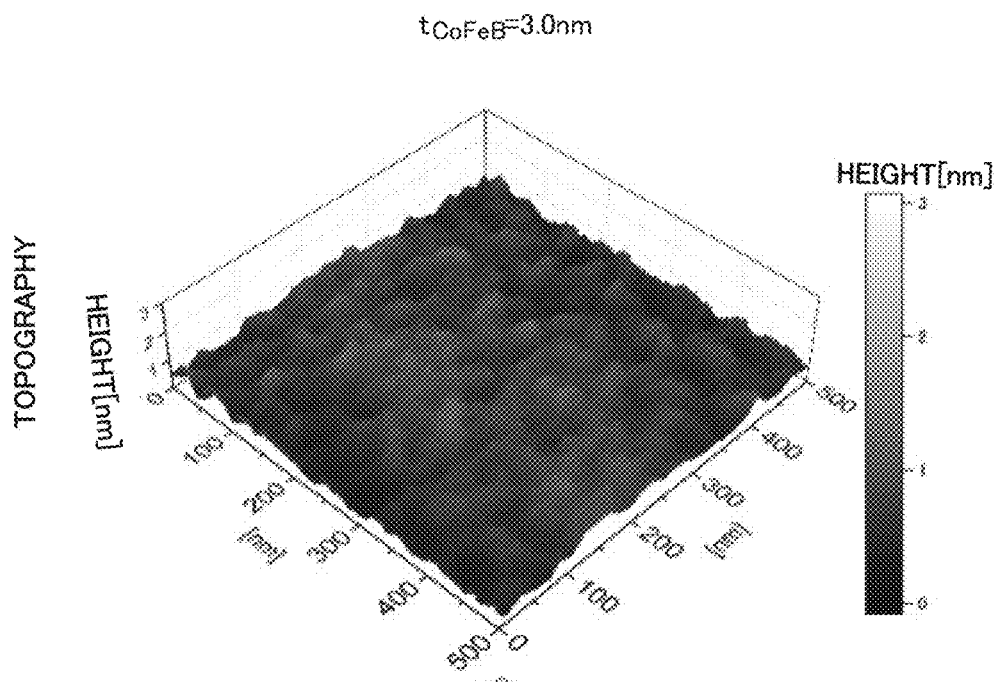
Figure 14B:
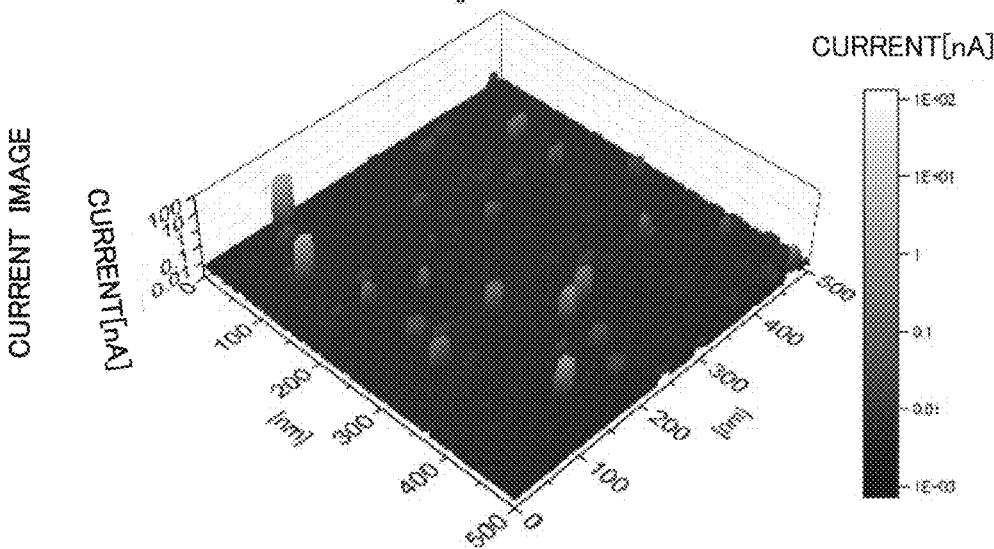

FIG. 9A is a graph showing the XPS analysis results on the surface of the MgO layer in the samples without a protection layer in which each MgO layer has a different thickness (Comparison Examples 1 to 4). From this results, the present inventors have made the following findings regarding the Mg2p spectrum. That is, the layer designated M1 in FIG. 9B, near 50.7 eV in FIG. 9A is an interface layer formed by the reaction between the underlying CoFeB and MgO that absorbed moisture, layer M2 near 49.6 eV is MgO that absorbed moisture ($Mg(OH)_2$), and layer M3 near 50.4 eV is MgO that absorbed no moisture. FIG. 9B shows schematic diagrams of Comparison Examples 1 to 4. As shown in FIGS. 9A and 9B, in Comparison Example 1 in which the thickness of the MgO layer is 0.4 nm, which is the smallest thickness, only layer M1 is formed. On the other hand, in Comparison Examples 2 and 3, both layers M1 and M2 are formed. In Comparison Example 4 where the thickness of the MgO layer is 3.0 nm, which is relatively large, a part of the MgO layer did not absorb $H_2O$. As a result, layers M2 and M3 (MgO layers) were formed, but layer M1 was not formed.

Next, an Mg2p spectrum analysis was conducted on the MgO layer with protection layer (Comparison Example 5, Working Examples 1 and 2), and the results this analysis were compared with the XPS analysis results for the surface of the MgO layer described above. FIGS. 10A to 10C are graphs showing the spectrum analysis results of Comparison Example 5 and Working Examples 1 and 2. As shown in FIG. 10A, in Comparison Example 5 where the 1 nm-thick protection layer is formed, the layers M1 and M2 are observed, which means that the MgO layer has absorbed moisture. That is, when a 1 nm-thick CoFeB film is used for the protection layer, it is not possible to sufficiently prevent the MgO layer from absorbing $H_2O$. On the other hand, in Working Example 1 with the 2 nm-thick protection layer and Working Example 2 with the 3 nm-thick protection layer, only the M3 component is observed, which means that the MgO layer did not absorb $H_2O$. This shows that, in order to prevent the reactions of the MgO layer with $CO_2$ and $H_2O$ in the atmosphere, the protection layer made of CoFeB needs to be at least 2 nm-thick. Furthermore, in Working Examples 3 to 5, i.e., the samples in which the MgO layer has different thicknesses, the MgO layer did not react with $H_2O$ or $CO_2$.

<Evaluation by Conductive AFM>

In conductive AFM, a conductive cantilever b1 is added to the configuration of the contact AFM device B, and by measuring current that flows through the surface of a sample to the probe of the cantilever, the surface profile image and the current value image of the sample can be provided at the same time. The samples having a CoFeB protection layer that underwent annealing at 400 degrees (Comparison Examples 5 and 6, Working Examples 1 and 2) were subjected to the conductive AFM evaluation, and the result of each example of topography are shown in FIGS. 11A, 12A, 13A and 14A, respectively, and the result of each example of a current image are shown in FIGS. 11B, 12B, 13B and 14B, respectively. In the sample having a 1 nm-thick protection layer (Comparison Example 5) and the sample having a 1.5 nm-thick protection layer (Comparison Example 6), the surface roughness was greater and the current image was flat in many areas, which indicates abnormal results. Those abnormal results were more pronounced in Comparison Example 5. The hydration of the MgO layer appears to the inventors to have been the cause of this abnormality. On the other hand, in the samples having a 2 nm-thick protection layer (Working Example 1) and 3 nm-thick protection layer (Working Example 2), the degree of surface roughness was small, and many current leak spots were observed. As a result, the leak spot density of the MgO layer was evaluated properly. That is, by forming the CoFeB protection layer to a thickness of 2 nm or greater, it was possible to prevent the MgO layer from reacting with $H_2O$ and $CO_2$ in the atmosphere, which would cause degradation.

Other Embodiments

In the description of the exemplary embodiment 2 above, an example in which an evaluation by a scanning probe microscope was conducted on the MgO layer in the middle of the manufacturing process of the spintronics element substrate having the MgO layer was explained. However, the above-mentioned exemplary embodiment 2 can also be applied to other types of inspections. When a spintronics element having an MgO layer at the uppermost layer thereof is subjected to an inspection during or after the manufacturing process, the spintronics element is exposed to the atmosphere on the way from the film forming equipment to the inspection equipment, and therefore, a problem similar to the one described above, i.e., alteration or degradation of characteristics of a non-magnetic uppermost layer of the element layer arises. To solve this problem, as described above, by forming the protection layer of the exemplary embodiment 2, alteration or degradation of characteristics of a non-magnetic uppermost layer of the element layer can be effectively prevented.

Specifically, in addition to the inspection using a scanning probe microscope equipped with a conductive cantilever, the spintronics element substrate 1 can also be applied to a surface roughness evaluation using a scanning probe microscope in a tapping mode. The method for keeping intermittent contact between a sample surface and a vibrating cantilever is called Dynamic Force Microscopy (DFM). Further, the substrate 1 can also be applied to a film thickness measurement by spectroscopic ellipsometry, a film thickness measurement by XRR (X-ray reflectometer), a film thickness measurement by an XRF (X-ray fluorescence) device, or the like. Furthermore, other types of evaluations and tests such as an evaluation using an optical microscope, a visual inspection, an evaluation by an XRD (X-ray diffraction) device, an evaluation by a CIPT (current-in-plane tunneling) device, an evaluation by an SEM (scanning electron microscope) device, and an evaluation of a sheet resistance on the spintronics element substrate 1 are made possible.

Not only in the case where the element is subjected to evaluations and tests, but also in other cases where the element is moved from one equipment to the other and a wafer container such as FOUP (front opening unified pod) or FOSB (front opening shipping box) is replaced, this protection layer can effectively prevent alteration of characteristics of the uppermost layer.

Furthermore, when it is necessary to move the element from one piece of equipment to another in various processes of manufacturing spintronics elements, such as heat treatment process, an electromagnetic radiation application process, a magnetic field application process, a lithography process, a dry-etching process, a film forming process, an ion implantation process, a plasma doping process, a wet-cleaning process, and a wafer binding process, there is a chance that the MgO layer will be exposed to the atmosphere and alteration of characteristics can occur in a manner similar to the above. Thus, in the examples of moving the spintronics elements between pieces of equipment for any of the manufacturing described above as well, by forming the protection layer 30 made of a CoFeB layer having a thickness of 2 nm or greater on the MgO layer 20, the alteration of characteristics of the MgO layer 20 can be prevented.

After the inspection or transfer between two pieces of equipment is completed, and the spintronics element substrate 1 with the protection layer described above is in an environment where the MgO layer is free from the risk of alteration of characteristics due to $H_2O$ and $CO_2$, the protection layer is removed. That is, if the manufacturing process has not completed yet, the rest of the spintronics element is formed as described below by conducting a film forming process and the like after the protection layer is removed. In the process of removing the protection layer, it is preferable to leave at least one-atomic layer on the MgO layer (surface) instead of completely removing the CoFeB protection layer. This is because in the MTJ element, the magnetic anisotropy (an interfacial magnetic anisotropy) is very important at the interface between the non-magnetic layer including Mg and O and the ferromagnetic layer including Fe or Co. This interfacial magnetic anisotropy perpendicular to the plane of the layers at the non-magnetic layer and the ferromagnetic layer interface is able to orient the magnetization of the ferromagnetic layer in a direction perpendicular to the plane layers. In particular, if the non-magnetic layer is a MgO layer, and the ferromagnetic layer is a CoFeB layer, this one-atomic layer plays an important role as the origin of the interfacial perpendicular magnetic anisotropy. When a ferromagnetic layer such as a CoFeB layer is formed on the MgO layer after the CoFeB protection layer is removed, the one-atomic layer has the important function of making the magnetic direction of the ferromagnetic layer perpendicular.

In the process of forming the rest of the spintronics element after removing the protection layer, the ferromagnetic layer may be formed by conducting a film forming process after removing the protection layer or by binding the spintronics element substrate with another spintronics element substrate. By binding two spintronics element substrates together to manufacture one spintronics element, it is possible to provide a device of higher quality. Such an exemplary embodiment will be explained below.

Exemplary Embodiment 3

In spintronic elements having a multi-layer structure, the crystal orientation or composition ratio of a film varies depending on the film forming equipment, and therefore, in some cases, better characteristics can be achieved by forming MTJ using a plurality of pieces of equipment rather than a signal piece of equipment. Thus, in the exemplary embodiment 3, a part of the MTJ element is formed by the equipment A, and then the rest of the element is formed by different equipment B. This exemplary embodiment 3 can be applied to the above-mentioned case in which a part of the spintronics element substrate 1 having the protection layer is formed by the equipment A, and after the inspection process or the like is conducted, the spintronics element substrate is returned to the equipment A for the film forming process to complete the spintronics element. That is, the film forming equipment B used after the inspection process or the like may be the same as the film forming equipment A or may be different.

Figure 15:
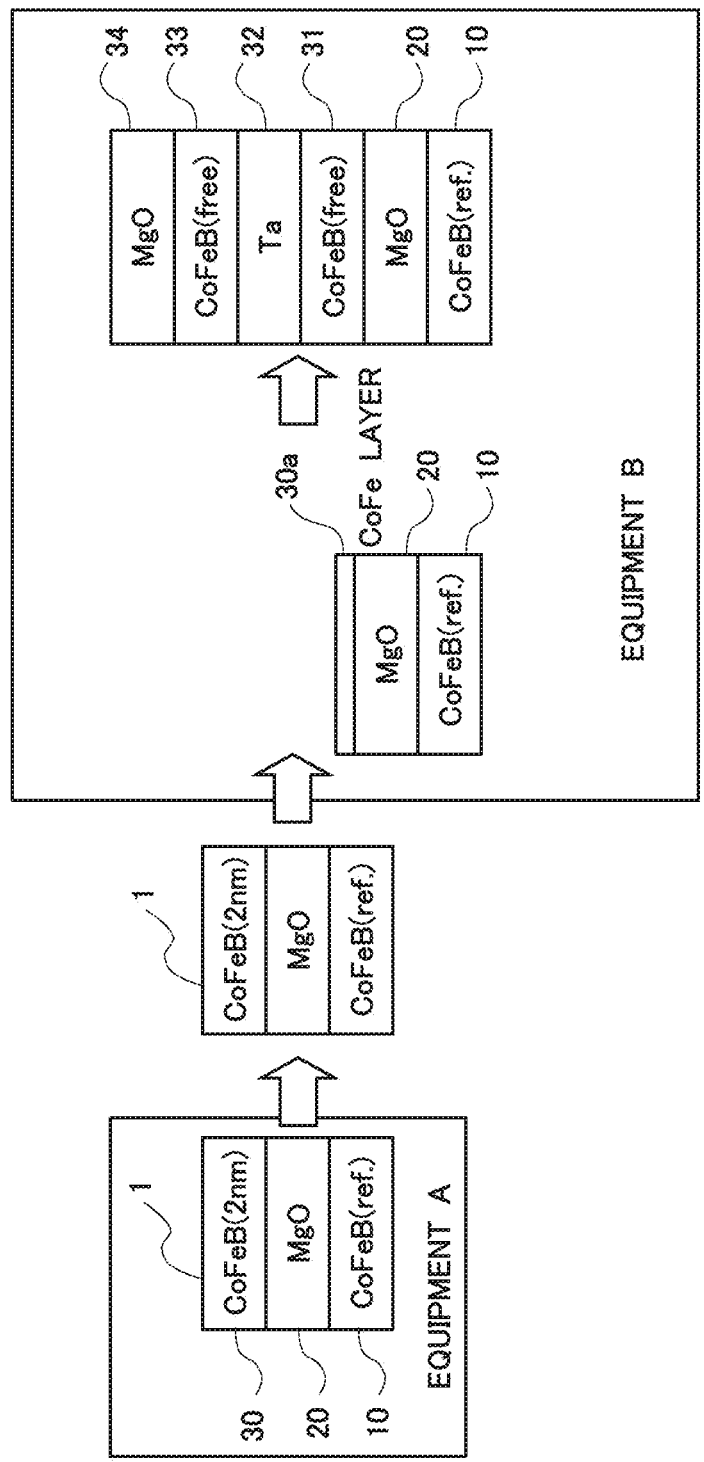
FIG. 15 is a schematic diagram for explaining the process of an exemplary embodiment.
Figure 16:
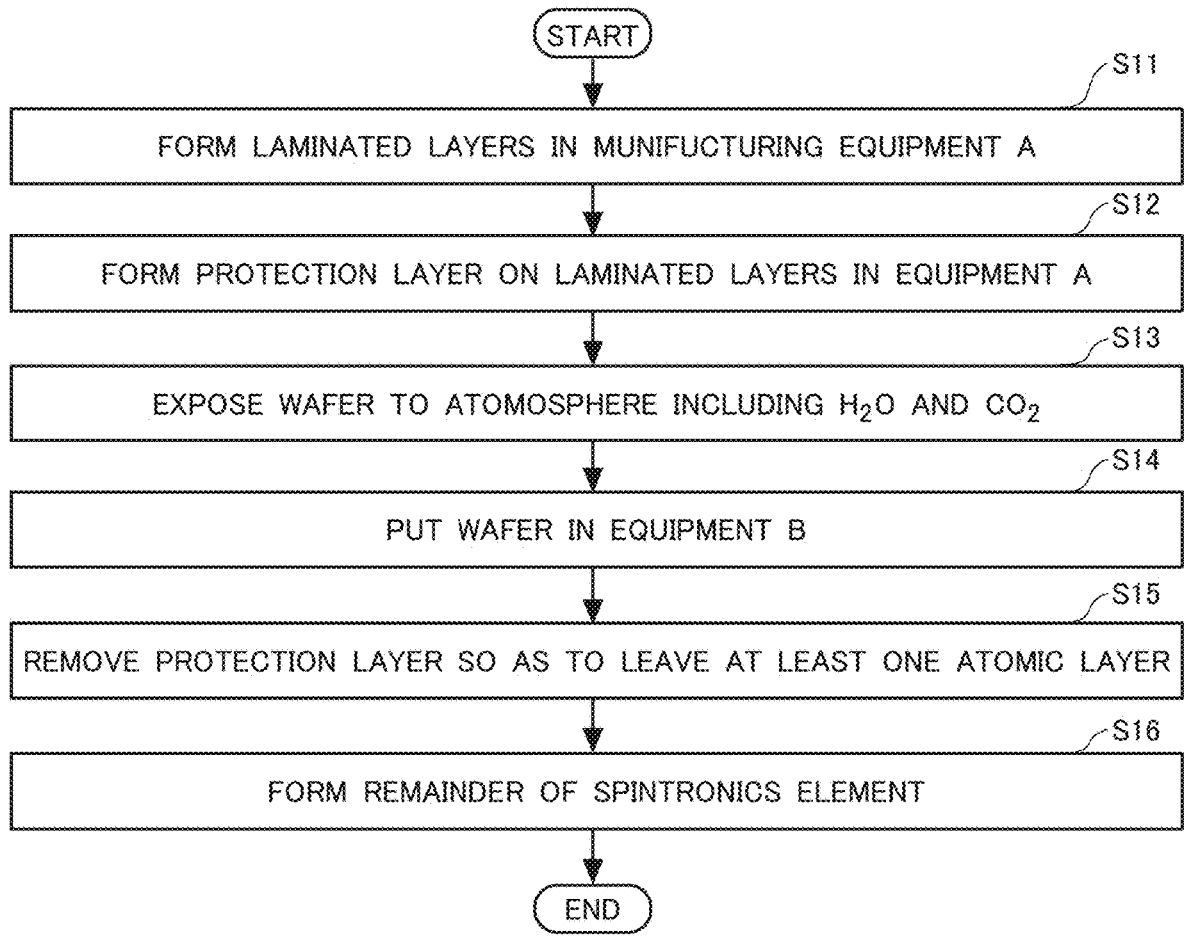
FIG. 16 is a flowchart showing the process of the exemplary embodiment.

FIG. 15 is a schematic diagram for explaining the process of the exemplary embodiment 3. FIG. 16 is a flowchart showing the process of the embodiment 3. As shown in FIG. 15, in the film forming equipment A (of a plant A1 not shown), for example, a spintronics element substrate 1 is manufactured up to the MgO layer of MTJ (FIG. 16: S11), and a protection layer 30 is formed thereon to prevent the degradation of the surface (FIG. 16: S12). Next, the spintronics element substrate 1 that has undergone a necessary process such as inspection outside of the equipment A in a plant A1 (not shown) is shipped to a plant B1 (not shown). The spintronics element substrate 1 is exposed to the outside atmosphere (FIG. 16: S13) during transfer, and then set in the equipment B in the plant B1 (FIG. 16: S14). The plant B1 may be the same as the plant A1, and the equipment B may be the same as the equipment A. However, even if the equipment A and the equipment B is the same equipment, as explained before, the spintronics element substrate 1 is exposed to the outside atmosphere when the inspection is performed. Next, the spintronics element substrate 1 set in the equipment B undergoes a process to remove the protection layer 30 such as reverse-sputtering (sputter-etching) or plasma etching. In this process, at least a portion of the protection layer 30 that is directly in contact with the MgO layer 20 (on the surface), i.e., one-atomic layer 30a, is not removed (FIG. 16: S15).

When the protection layer was a CoFeB layer, the one-atomic layer 30a exists as a CoFe layer. As described above, this CoFe layer is the origin of the interfacial perpendicular magnetic anisotropy. When a ferromagnetic layer such as a CoFeB layer is formed on the MgO layer after the CoFeB protection layer is removed, the CoFe layer has the important function of making the magnetic direction of the ferromagnetic layer perpendicular. Even if the protection layer is made of a CoFeB layer, because this one-atomic layer 30a is a CoFe polycrystalline layer, the presence thereof can be observed by an electronic microscope or the like. That is, even if the ferromagnetic layer such as a CoFeB layer is to be formed on the one-atomic layer 30a, because the one-atomic layer 30a has a crystal structure differing from that of the ferromagnetic layer, the presence thereof can be confirmed using an electronic microscope or the like. In the film forming equipment B, a first recording layer 31 made of CoFeB, a Ta layer 32 functioning as the non-magnetic layer, a second recording layer 33 made of CoFeB, and a non-magnetic layer 34 made of MgO, for example, are formed in this order, thereby completing the spintronics element (FIG. 16: S16).

As described above, in the exemplary embodiment 3, the spintronics element substrate 1 is manufactured by the equipment A in the plant A1, for example, and then transferred to the plant B1 where a part of the protection layer 30 is removed by the equipment B so as to leave at least one-atomic layer 30a. After that, the film forming process is resumed. That is, in the spintronics element substrate 1 having the protection layer 30 of the exemplary embodiment 3, the alteration of characteristics of the MgO layer 20 can be prevented by the protection layer 30 even during the manufacturing process, and therefore, it is possible to ship the spintronics element substrate to a different plant including overseas locations. Because the films can be formed using a plurality of film forming equipment, spintronics elements of higher quality can be provided. In the above description of the exemplary embodiment 3, a case in which the spintronics element is completed by two pieces of equipment was explained, but the protection layer 30 may be formed as many times as necessary, for example, when the element substrate is moved from one piece of equipment to the another, when an inspection is conducted on the element substrate, or the like.

Exemplary Embodiment 4

Next, an exemplary embodiment 4 will be explained. In the embodiment 4, an example of forming one spintronics element by binding together two separately-prepared spintronics element substrates will be explained. This manufacturing method provides spintronics elements with improved crystal orientation. The specific method will be explained below.

Figure 17:
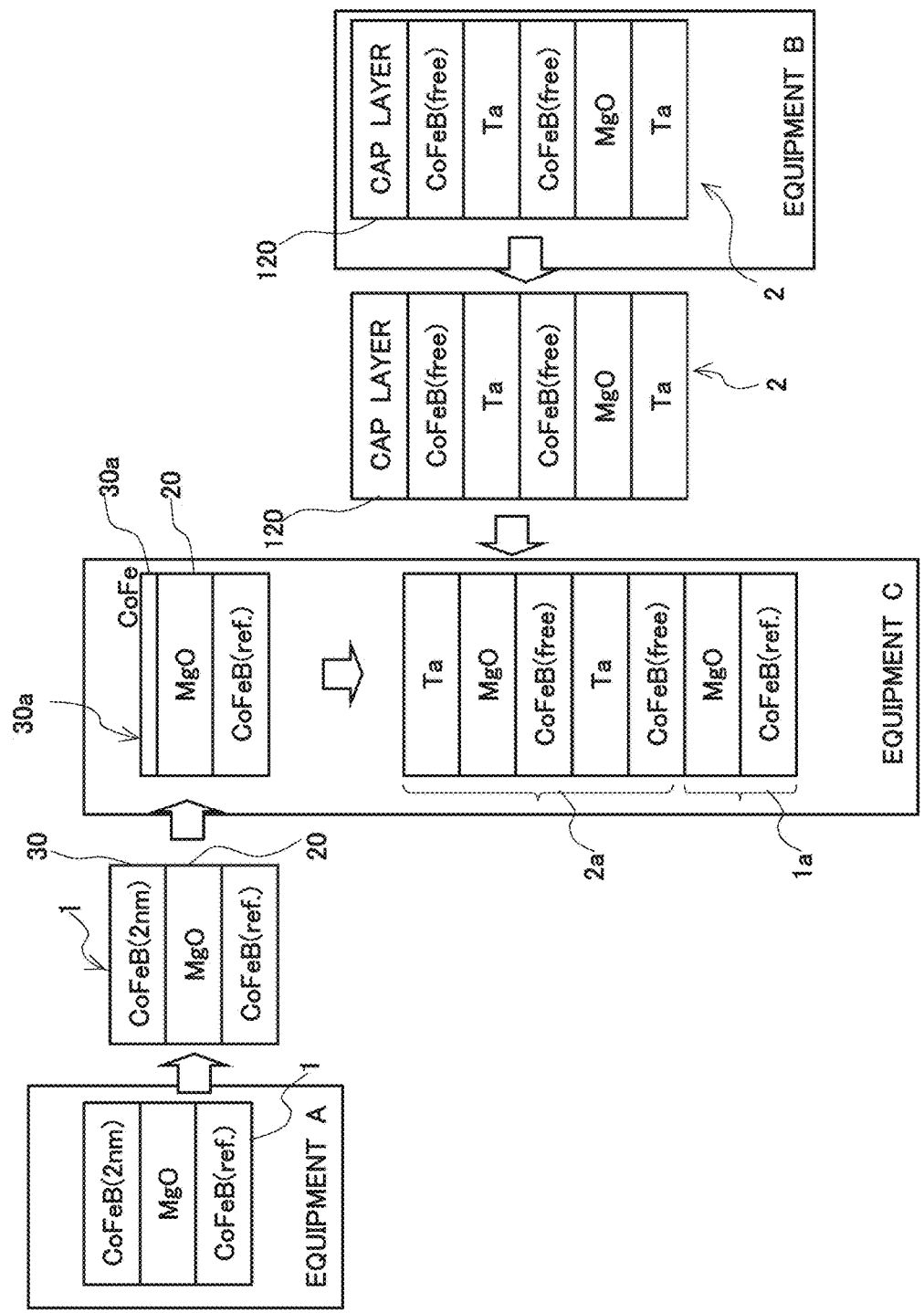
FIG. 17 is a schematic diagram showing a binding process of an exemplary embodiment.
Figure 18:
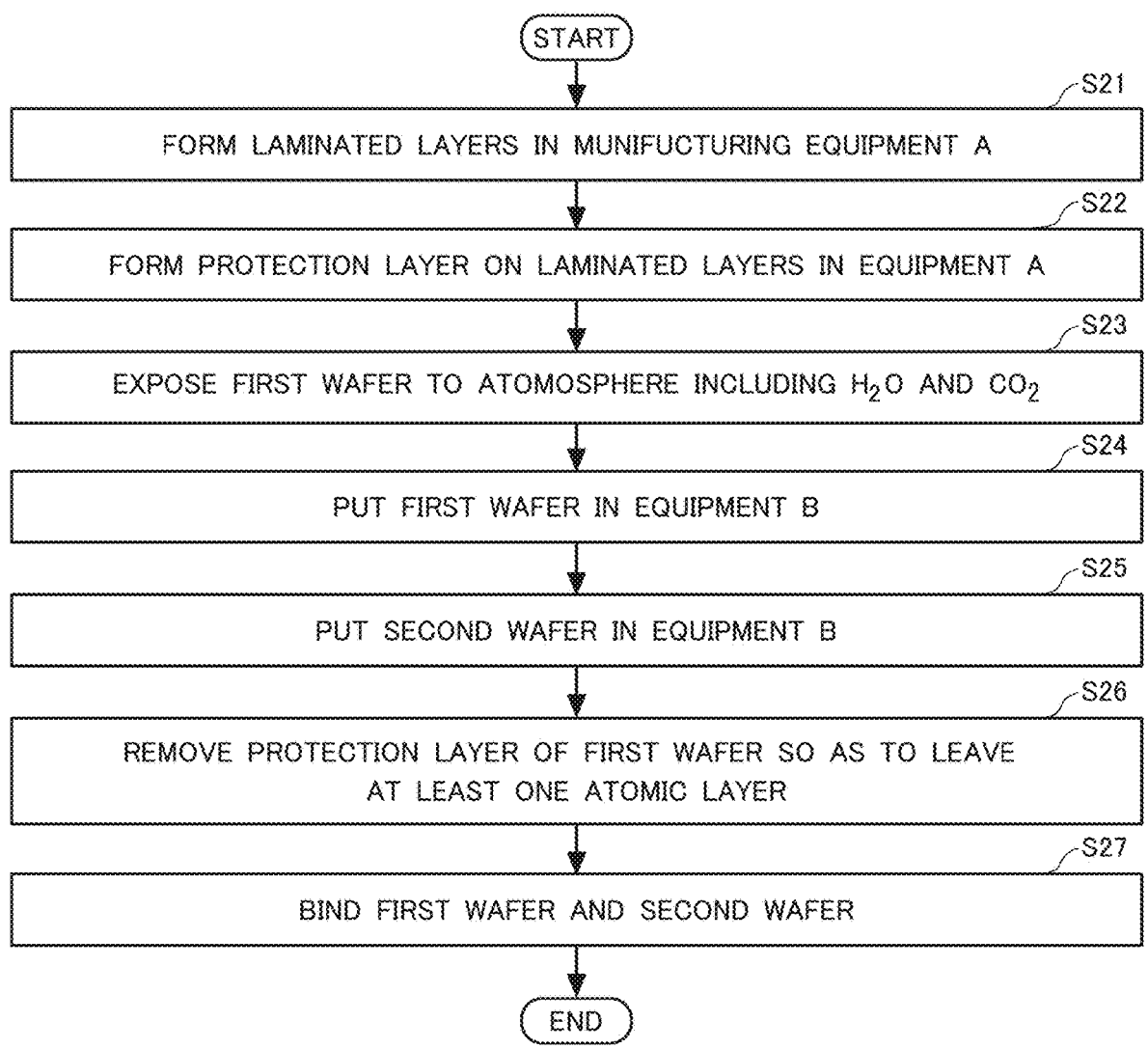
FIG. 18 is a flowchart of a process of an exemplary embodiment.

FIG. 17 is a schematic diagram showing a binding process of the exemplary embodiment 4, and FIG. 18 is a flowchart of the process. As described above, spintronics elements of a single junction, a double junction, and a quad junction include a plurality of metal layers and insulating layers, and therefore, the physical characteristics (such as crystal orientation and crystal particle size) differ between the upper part and the lower part of the magnetic tunnel junction (MTJ), even if the two parts are made of the same material. For example, in the double junction, the crystal orientation of the upper MgO layer differs from that of the lower MgO layer. Also, in the double reference layer MTJ, the coercive force of the upper reference layer is smaller than that of the lower reference layer in some cases. By dividing MTJ into a top part and a bottom part or three or more parts, manufacturing the respective parts separately, and binding them together, the above-mentioned problem can be avoided, and MTJ with even orientation and desired characteristics can be obtained.

As shown in FIGS. 17 and 18, in the film forming equipment A, for example, a spintronics element substrate 1 (first wafer) is manufactured up to the MgO layer of the MTJ (FIG. 18: S21), and a protection layer 30 is formed thereon to prevent the degradation of the surface (FIG. 18: S22). Next, the spintronics element substrate 1 that has undergone a necessary process such as an inspection is shipped to equipment C. The spintronics element substrate 1 is exposed to the atmosphere (FIG. 18: S23) during transfer. The transferred spintronics element substrate 1 is set in the equipment C (FIG. 18: S24). The equipment C may be the same as the equipment A.

On the other hand, in the film forming equipment B, a spintronics element substrate (second wafer) 2 is manufactured. The spintronics element substrate 2 includes a substrate not shown in the figure, and on this substrate, a Ta layer as an underlayer, an MgO layer as a non-magnetic layer, a CoFeB layer as a first recording layer, a Ta layer as a non-magnetic layer, and a CoFeB layer as a second recording layer are formed in this order. The spintronics element substrate 2 is also exposed to the atmosphere during transfer, and therefore, a cap layer 120 is formed to prevent degradation of the uppermost CoFeB layer. The spintronics element substrate 2 is transferred and set in the equipment C (FIG. 18: S25). The equipment B may be the same as the equipment C, and the equipment B may be the same as the equipment A.

Next, the spintronics element substrate 1 set in the equipment C undergoes a process to remove the protection layer 30 such as reverse-sputtering (sputter-etching) or plasma etching. In this process, at least a part of the protection layer 30 that is in contact with the MgO layer 20 (on the surface), i.e., one-atomic layer 30a, is not removed (FIG. 18: S26). The cap layer 120 formed on the spintronics element substrate 2 is removed as well. Then, the spintronics element substrate 1a after removing the protection layer 30 except for the one-atomic layer 30a, and the spintronics element substrate 2a after removing the cap layer 120 are bound together such that the respective exposed surfaces make contact with each other, thereby forming a spintronics element (FIG. 18: S27).

Other Embodiments

Figure 19:
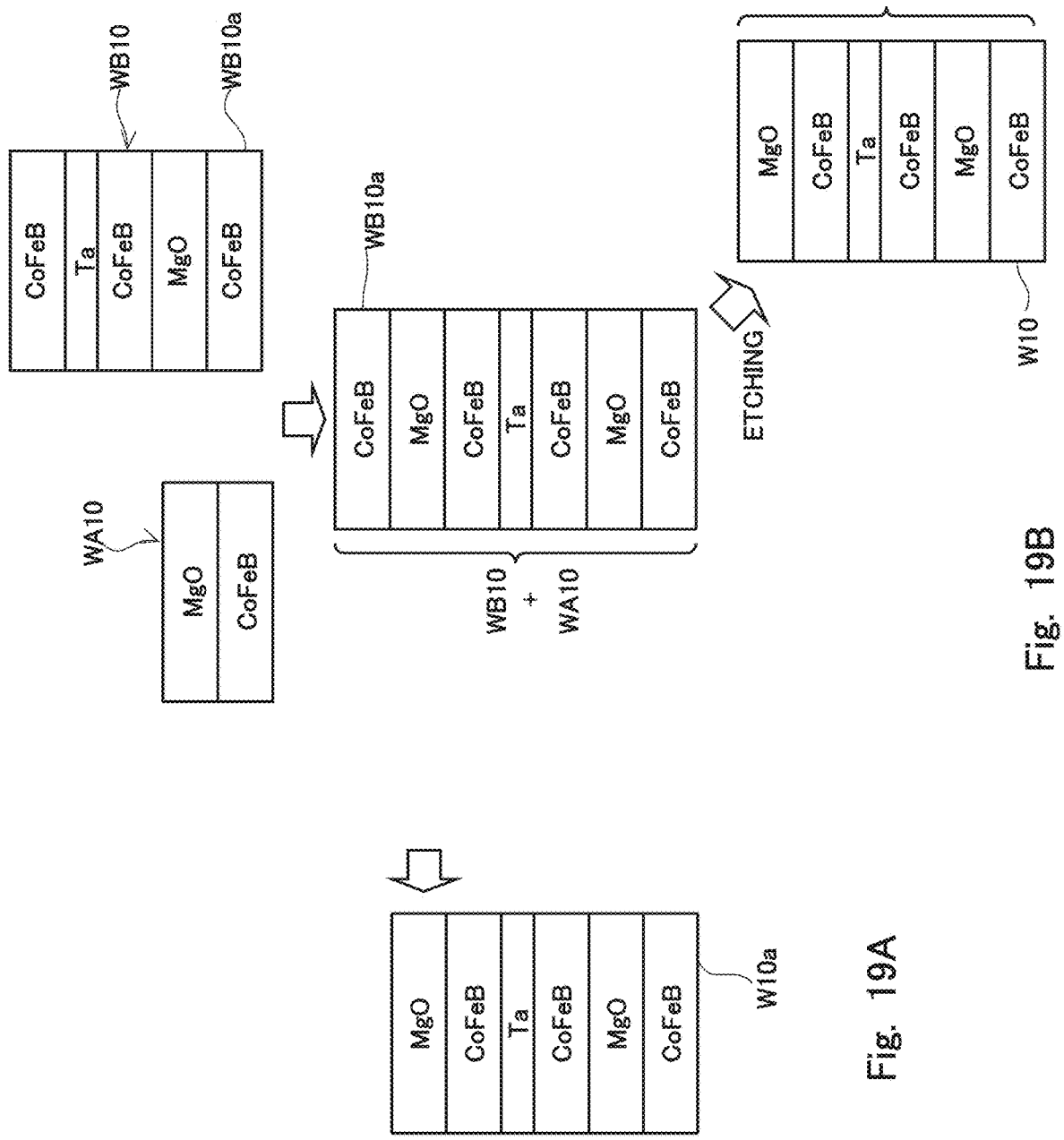
FIG. 19A is a diagram for explaining a conventional process of a spintronics element having a double junction structure.
FIG. 19B is a diagram for explaining a process of manufacturing the spintronics element by binding a plurality of substrates using the process of an exemplary embodiment.
Figure 22:
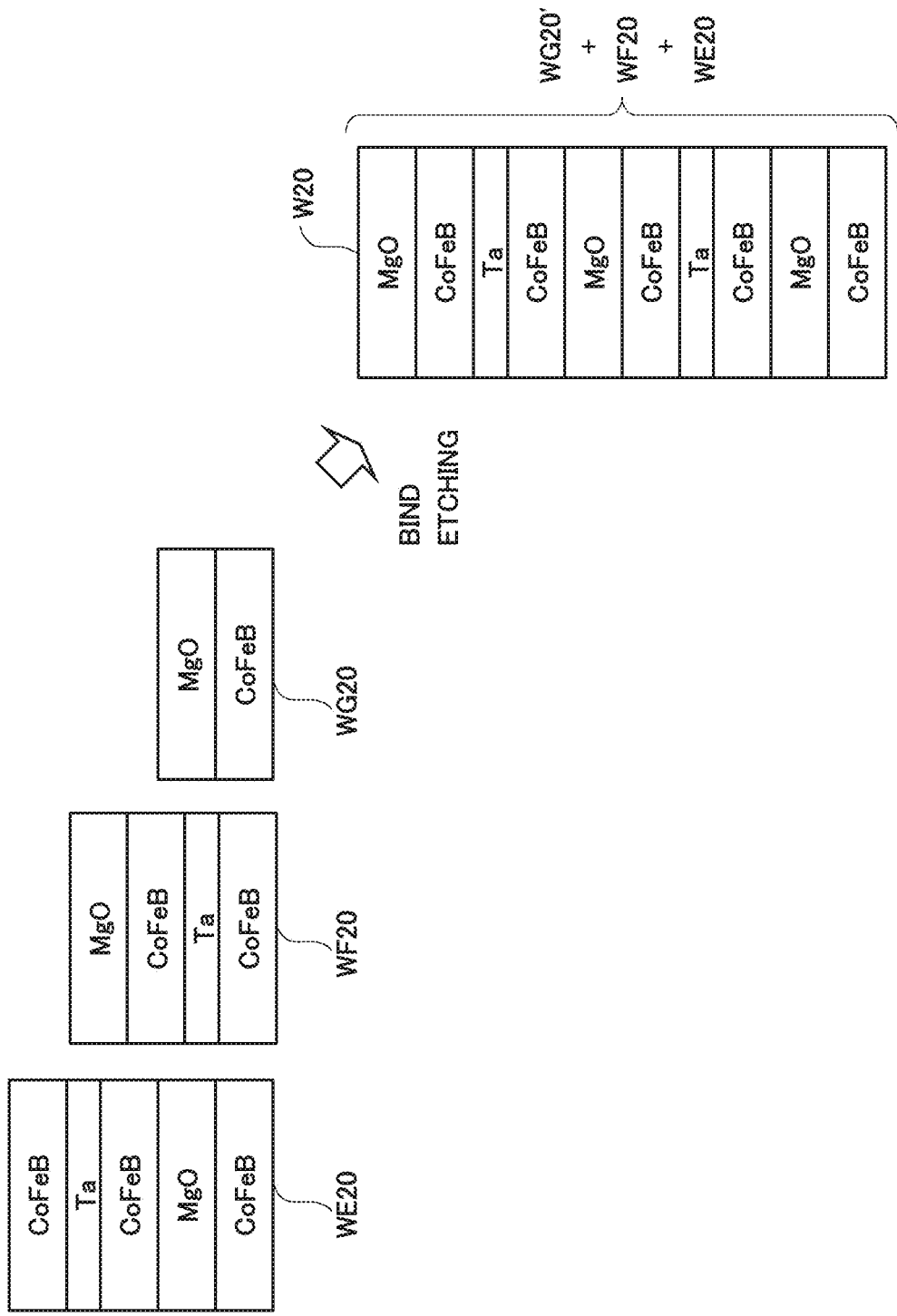
Figure 23:
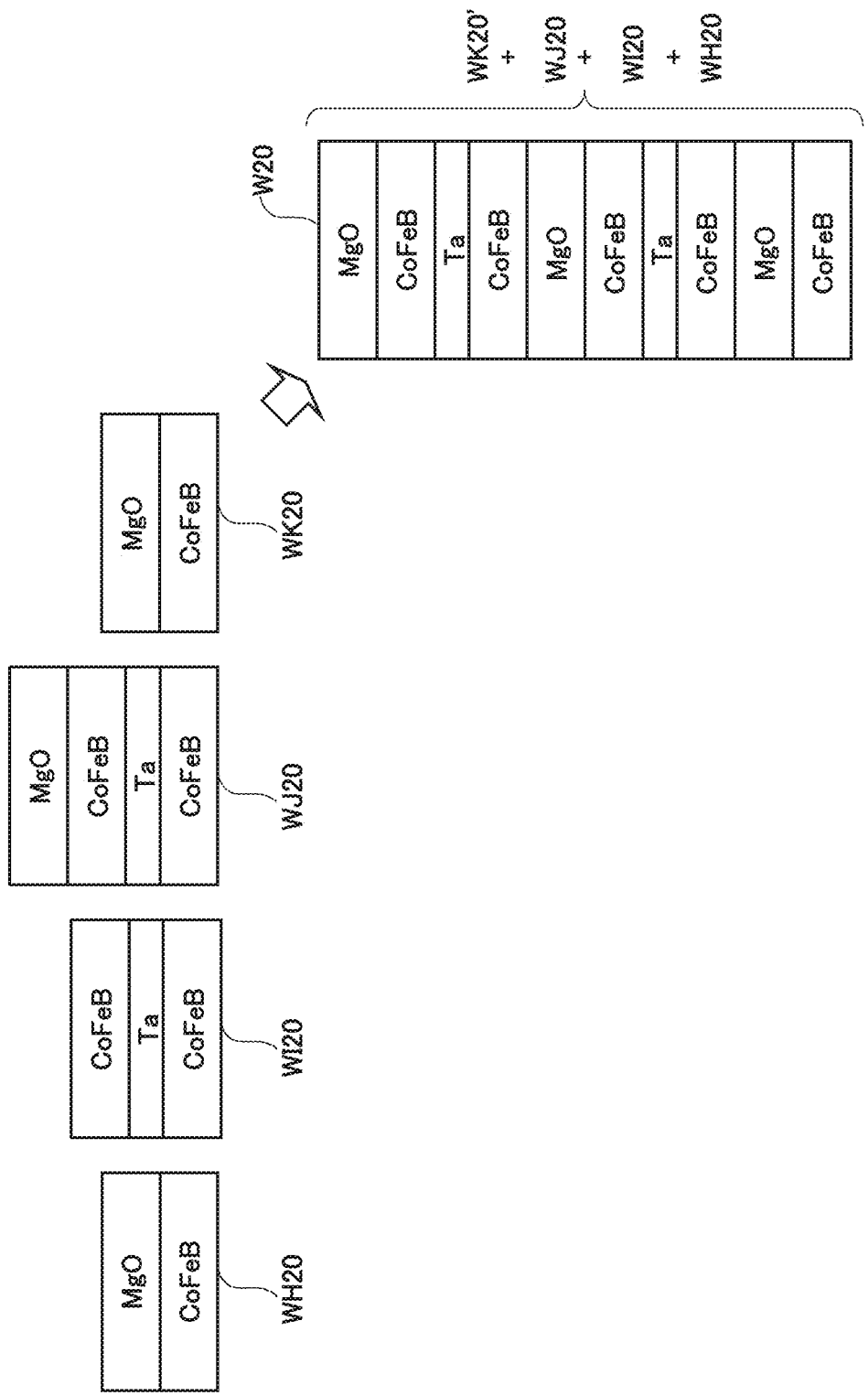
Figure 24B:
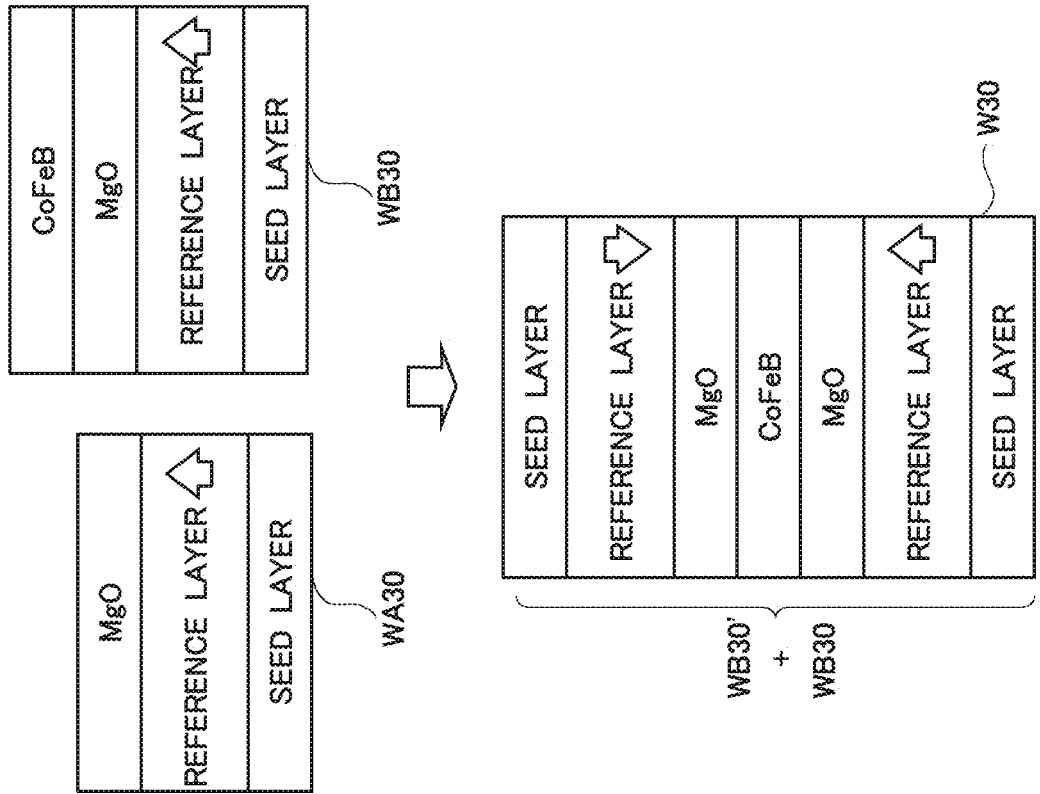
FIGS. 24A and 24B are diagrams for explaining the manufacture of a spintronics element having the double reference structure.
Figure 24A:
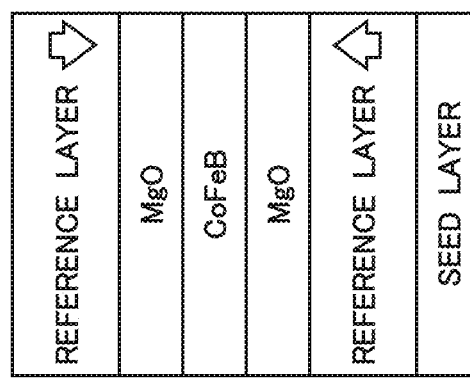

Next, another example of the spintronics element that is manufactured through a binding process will be explained. FIGS. 19 to 25 are schematic diagrams for explaining the process. FIG. 19A is a diagram for explaining a conventional process of a spintronics element having the double junction structure, and FIG. 19B is a diagram for explaining a process of manufacturing the spintronics element by binding a plurality of substrates using the processes of the other embodiments. Similarly, FIGS. 20A and 20B are diagrams for explaining the manufacture of a spintronics element of the quad junction structure, FIGS. 21 to 23 are diagrams for explaining the manufacture of other types of spintronics elements of the quad junction structure, FIGS. 24A and 24B are diagrams for explaining the manufacture of a spintronics element having the double reference structure, and FIGS. 25A and 25B are diagrams for explaining the manufacture of a magnetic domain wall motion type memory element.

As shown in FIG. 19A, in the double junction structure W10a, if the respective layers are simply stacked from the bottom, crystal properties such as crystallinity and crystal orientation of an MgO uppermost layer would degrade. In this example, on the other hand, as shown in FIG. 19B, a spintronics element substrate W10 (WA10+WB10') is formed by placing a first spintronics element substrate WA10 having a protection layer (not shown) formed on the MgO uppermost layer 20 and a second spintronics element substrate WB10 having a cap layer, (CoFeB layer in this example) as an uppermost layer WB10a in the same equipment as described above, removing all but of one-atomic layer of the protection layer of the first spintronics element substrate WA10 (not shown), binding the first spintronics element substrate WA10 with the second spintronics element substrate WB10, and removing the uppermost layer WB10a, i.e., the cap layer of the second spintronics element substrate WB10 by etching. The second spintronics element substrate in which the uppermost layer WB10a is removed is shown as WB10' in FIG. 19B. This manufacturing method provides spintronics elements W10 with excellent crystal properties including crystallinity and crystal orientation. Specifically, when the protection layer of the first spintronics element substrate WA10 is removed, a one-atomic CoFe layer is left on the MgO uppermost layer, as explained initially with respect to exemplary embodiments 1 and 2. A microstructure between the MgO layer and the CoFe layer is MgO(001) [001]//CoFe(001)[011], whereby the crystal orientation of the spintronics element W10 is improved.

As shown in FIG. 20A, in the quad junction structure W20a as well, the method of simply stacking the respective layers from the bottom would cause the crystal properties such as crystallinity and crystal orientation explained above to get worse in upper layers. In this example, on the other hand, as shown in FIG. 20B, a spintronics element W20 (WA20+WB20') is formed by binding a first spintronics element substrate WA20 having a protection layer (not shown) formed on the uppermost MgO layer 20 with a second spintronics element substrate WB20, and removing the uppermost layer, i.e., the cap layer WB20a, (CoFeB layer in this example) of the second spintronics element substrate WB20 by etching. The second spintronics element substrate in which the uppermost layer WB20a is removed is shown as WB20' in FIG. 20B This way, it is possible to obtain the spintronics element W20 with even upper layers having excellent properties such as crystallinity and crystal orientation explained above.

Figure 20:
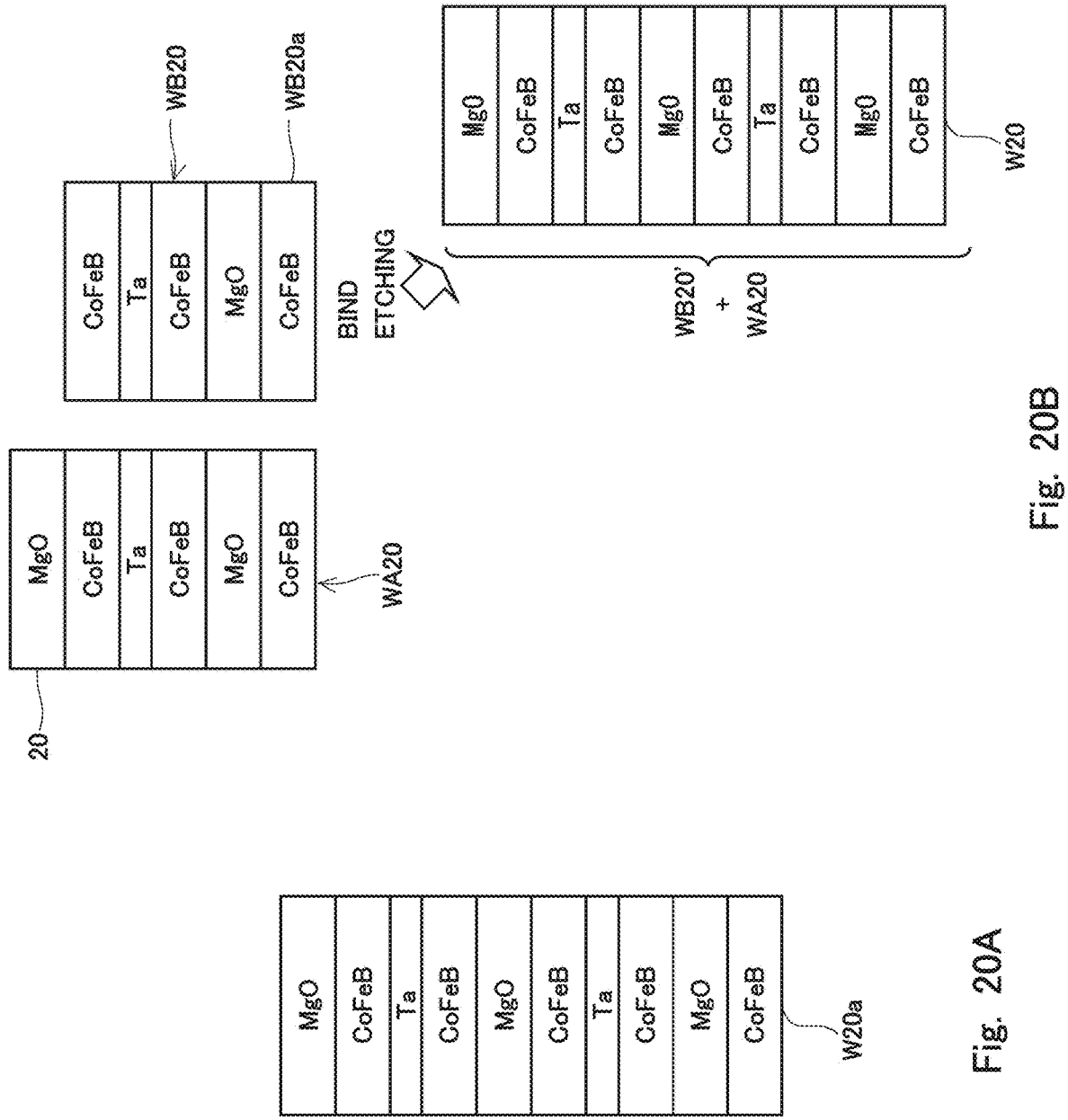
FIGS. 20A and 20B are diagrams for explaining the manufacture of a spintronics element of the quad junction structure.
Figure 21:
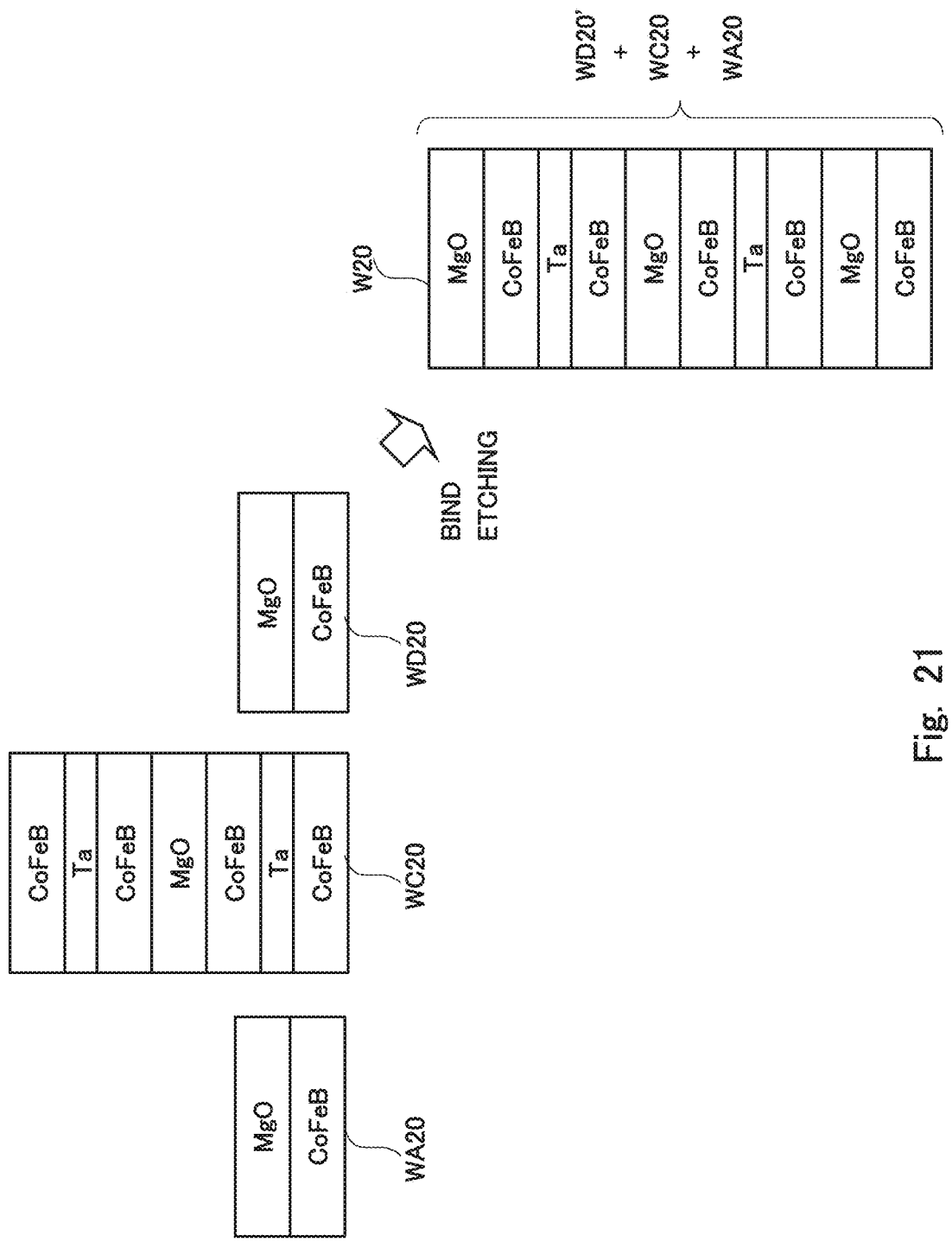
FIGS. 21-23 are diagrams for explaining the manufacture of three other types of spintronics element of the quad junction structure.

The number of substrates to be bound is not limited to two, and as shown in FIG. 21 or 20, three or more spintronics element substrates, such as the first to third spintronics element substrates WA20, WC20, and WD20, or the first to third spintronics element substrates WE20, WF20, and WG20, may be bound together to form one spintronics element. Furthermore, as shown in FIG. 23, the first to fourth spintronics element substrates WH20, WI20, WJ20, and WK20 may be bound together. A protection layer needs to be formed on the substrate having the MgO uppermost layer, and in the process of removing the protection layer, one-atomic layer needs to be left.

As shown in FIG. 24A, in the double reference structure W30a as well, the method of simply stacking the respective layers from the bottom would cause the crystal properties such as crystallinity and crystal orientation explained above to get worse in upper layers. In this example, on the other hand, as shown in FIG. 24B, by binding a first spintronics element substrate WA30 having a protection layer (not shown) formed on the uppermost MgO layer 20 with a second spintronics element substrate WB30, it is possible to obtain a spintronics element W30 in which even upper layers have excellent properties such as crystallinity and crystal orientation explained above.

As shown in FIG. 25A, in a magnetic domain wall motion memory element structure W40a having a magnetic domain wall motion layer, the MgO layer and the CoFeB layer formed on the magnetic domain wall motion layer are affected by the magnetic domain wall motion layer and the orientation thereof would degrade. To solve this problem, as shown in FIG. 25B, by placing a first spintronics element substrate WA40 having a magnetic domain wall motion layer and a second spintronics element substrate WB40 having another layer structure and protection layer (not shown) in the same equipment, removing the protection layer of the second spintronics element substrate WB40 so as to leave one-atomic layer, and binding the second spintronics element substrate WB40 with the magnetic domain wall motion layer, a spintronics element W40 having an excellent magnetic characteristic such as the TMR (tunnel magnet resistance effect) can be obtained. Alternatively, as shown in FIG. 25C, by binding a first spintronics element substrate WC40 having a magnetic domain wall motion layer, MgO layer and protection layer (not shown) in this order with a second spintronics element substrate WD40 having another layer structure, a spintronics element W40 having excellent magnetic characteristic such as TMR (tunnel magnet resistance effect) can be obtained.

When the magnetic direction is perpendicular, the magnetic domain wall motion layer is made of a multi-layer structure of Co/Ni, for example, (S. Fukami, et al., IEEE Trans. Magn. 50, 3401006 (2014)), a multi-layer structure of Ta layer/Ru layer/CoCrPt layer/Pt layer laminated in this order from the lower layer (H. Tanigawa, et al., Appl. Phys. Exp. 1, 011301 (2008)), or a multi-layer structure of Ta layer/CoFeB layer/MgO layer/Ta layer laminated in this order from the lower layer (S. Fukami, et al., Appl. Phys. Lett. 98, 082504 (2011)). When the magnetic direction is horizontal, the magnetic domain wall motion layer is made of a NiFe layer, for example (H. Numata, et al., VLSI Technology, Symp. 232 (2007)).

Figures 26A, 26B:
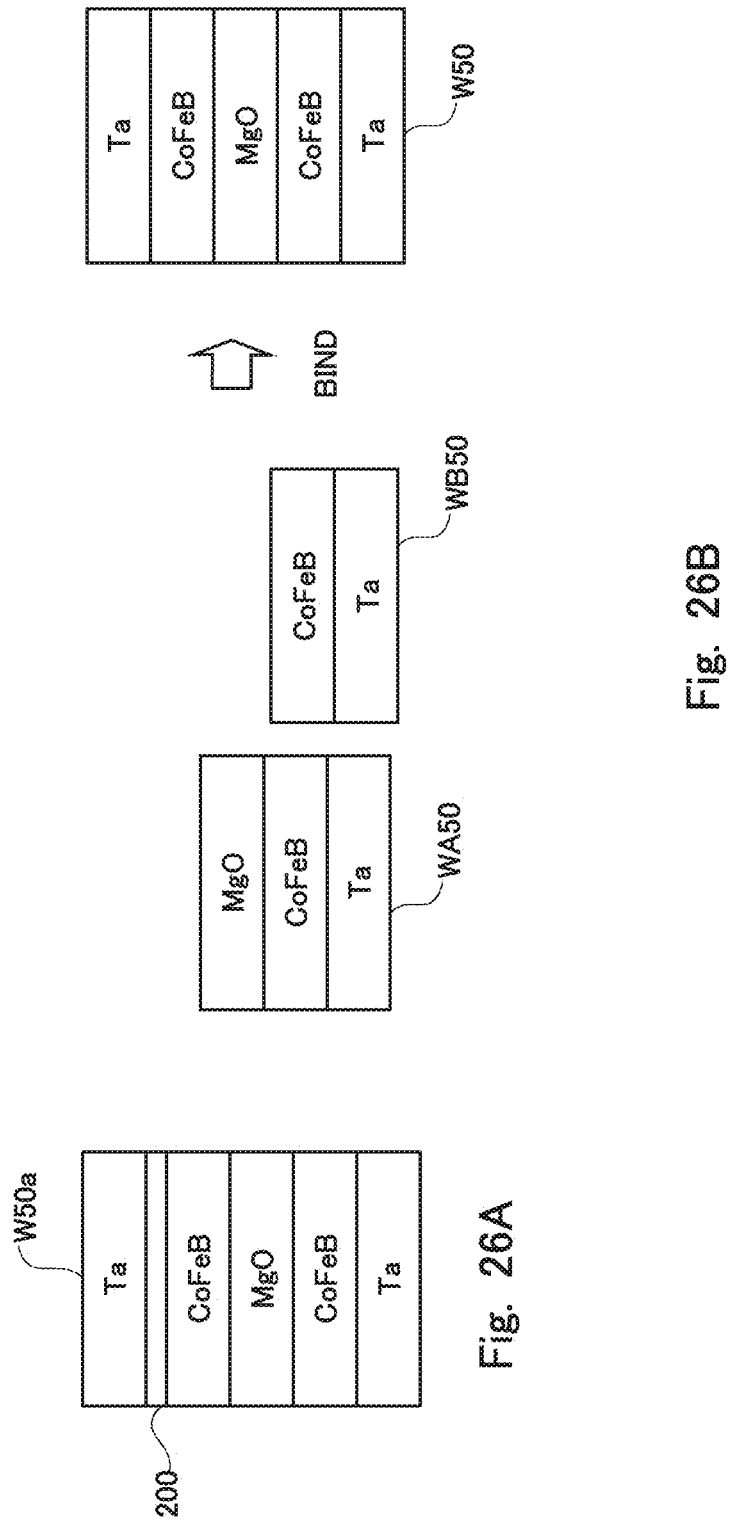
FIGS. 26A and 26B are diagrams for explaining the dead layer.

The MTJ manufactured by the binding process of this example is characterized by the fact that, in the case of the single MTJ, for example, the ferromagnetic layer (CoFeB) under the Ta layer does not have a layer having no magnetization (or dead layer). FIGS. 26A and 26B are diagrams for explaining the dead layer. In a substrate W50a manufactured by a method of simply stacking the respective layers as in the conventional method, when a Ta layer is formed on a CoFeB layer, a dead layer 200 is formed in the CoFeB layer, which causes a problem in some cases. As shown in FIG. 26A, when a Ta layer is formed on the upper CoFeB layer, for example, the dead layer 200 not having magnetization of about several angstroms (Å) is formed in a part of the CoFeB layer adjacent to the Ta layer. This dead layer 200 is not formed between the lower CoFeB layer and the Ta layer in the lower part (see S. Ikeda, et al., Mat. Mater. 9, 721 (2010)). Similar problems might arise when a Ru layer is to be formed as the cap layer (see S. Y. Jang, et al., J. Appl. Phys. 107, 09C707 (2010)). The formation of the dead layer can be suppressed by forming a NiFeHf layer as the cap layer or the like, but it is difficult to completely eliminate the dead layer (see U.S. Pat. No. 8,378,330 B2). On the other hand, as shown in FIG. 26B, when the substrate W50 is manufactured by binding the first substrate WA50 with the second substrate WB50 using the binding method of the above embodiment 4, the dead layer 200 is not formed between the upper CoFeB layer and the upper Ta layer, and therefore, it is possible to obtain a substrate W50 of higher quality.

As described above, according to the above embodiments, in the manufacturing process of spintronics elements having an MgO layer or the like that changes in quality by the reaction with $H_2O$ and $CO_2$, and when the manufacturing process requires the wafer having the MgO layer at the uppermost layer (spintronics element substrate) to be exposed to the atmosphere, by forming a CoFeB cap layer on the uppermost layer, the degradation of the MgO uppermost layer can be suppressed. This allows various processes to be conducted that would significantly degrade the characteristics of the spintronics element with the conventional configuration.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A structure used in the formation of a spintronics element, the spintronics element to include a plurality of laminated layers, comprising:
   a substrate;
   a plurality of laminated layers formed on the substrate, an uppermost layer of the plurality of laminated layers being a non-magnetic layer containing oxygen; and
   a protection layer directly formed on the uppermost layer, no other layer being directly formed on the protection layer, wherein
   the protection layer is one atomic layer forming an origin of an interfacial perpendicular magnetic anisotropy between the uppermost layer and a ferromagnetic layer to be formed on the one atomic layer.

2. The spintronics element according to claim 1, wherein the protection layer includes at least a material selected from the group of material consisting of Co, Fe and B.

3. The spintronics element according to claim 2, wherein the non-magnetic layer includes Mg and O.

4. The spintronics element according to claim 3, wherein a second uppermost layer of the plurality of laminated layers, and the protection layer, are both made of a same material.

5. The spintronics element according to claim 1, wherein the plurality of laminated layers include an underlayer and a ferromagnetic layer disposed on the underlayer and directly below the uppermost layer.

6. The spintronics element according to claim 5, wherein a magnetization direction of the ferromagnetic layer is fixed in a direction perpendicular to a surface of the ferromagnetic layer.

7. The spintronics element according to claim 5, wherein a magnetization direction of the ferromagnetic layer is not fixed to either an upward or downward direction that is perpendicular to a surface of the ferromagnetic layer.

8. The spintronics element according to claim 1, wherein the plurality of laminated layers include an underlayer, a first ferromagnetic layer disposed on the underlayer, a non-magnetic binding layer disposed on the first ferromagnetic layer, and a second ferromagnetic layer disposed on the non-magnetic binding layer.

9. The spintronics element according to claim 8, wherein a first magnetization direction of the first ferromagnetic layer and a second magnetization direction of the second ferromagnetic layer are fixed in a same direction perpendicular to a surface of the ferromagnetic layer.

10. The spintronics element according to claim 8, wherein a first magnetization direction of the first ferromagnetic layer and a second magnetization direction of the second ferromagnetic layer are fixed in directions perpendicular to a surface of the ferromagnetic layer, the first magnetization direction being a direction opposite to the second magnetization direction.

11. The spintronics element according to claim 8, wherein each of a first magnetization direction of the first ferromagnetic layer and a second magnetization direction of the second ferromagnetic layer is not fixed to either an upward or downward direction that is perpendicular to a surface of the ferromagnetic layer.

12. The spintronics element according to claim 1, wherein the plurality of laminated layers include a magnetic domain wall motion layer.

13. The spintronics element according to claim 1, further comprising an upper protection layer continuously formed on the one atomic layer formed directly on the uppermost layer and preventing alteration of characteristics of the uppermost layer while exposed in an atmosphere including H₂O, a partial pressure of $H_2O$ in the atmosphere being equal to or larger than $10^{-4}$ Pa, wherein
a total thickness of the protection layer and the upper protection layer is greater than 3 nm.

14. A spintronics element, comprising
an underlayer; and
four laminated layers, including
a first ferromagnetic layer formed on the underlayer,
a non-magnetic layer formed on the first ferromagnetic layer,
a protection layer formed directly on the non-magnetic layer, and
a second ferromagnetic layer formed directly on the protection layer,
a cap layer formed on the second ferromagnetic layer, wherein
a surface portion of the second ferromagnetic layer directly contacting the protection layer is free of any layer having no magnetization.

15. The spintronics element according to claim 14, wherein the protection layer is one atomic layer forming an origin of an interfacial perpendicular magnetic anisotropy between the non-magnetic layer and the second ferromagnetic layer.

16. The spintronics element according to claim 14, wherein a magnetization direction of the second ferromagnetic layer is fixed in a direction perpendicular to a surface of the second ferromagnetic layer.

* * * * *